(12) United States Patent
Yamashita

(10) Patent No.: US 12,177,987 B2
(45) Date of Patent: Dec. 24, 2024

(54) SENSOR MODULE

(71) Applicant: SONY SEMICONDUCTOR SOLUTIONS CORPORATION, Kanagawa (JP)

(72) Inventor: Yutaro Yamashita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 199 days.

(21) Appl. No.: 17/797,345

(22) PCT Filed: Feb. 5, 2021

(86) PCT No.: PCT/JP2021/004339
§ 371 (c)(1),
(2) Date: Aug. 3, 2022

(87) PCT Pub. No.: WO2021/161919
PCT Pub. Date: Aug. 19, 2021

(65) Prior Publication Data
US 2023/0054092 A1 Feb. 23, 2023

(30) Foreign Application Priority Data
Feb. 10, 2020 (JP) ................................. 2020-020818

(51) Int. Cl.
*H05K 3/32* (2006.01)
*H04N 23/51* (2023.01)
*H04N 23/54* (2023.01)

(52) U.S. Cl.
CPC ............ *H05K 3/328* (2013.01); *H04N 23/51* (2023.01); *H04N 23/54* (2023.01)

(58) Field of Classification Search
None
See application file for complete search history.

(56) References Cited

U.S. PATENT DOCUMENTS

| 8,675,127 B2* | 3/2014 | Nakajima | H04N 23/55 |
| | | | 348/374 |
| 9,307,128 B2* | 4/2016 | Ning | G02B 7/003 |
| 10,015,377 B2* | 7/2018 | Sesti | H04N 23/63 |

(Continued)

FOREIGN PATENT DOCUMENTS

| JP | 5413231 B2 | 2/2014 |
| JP | 2017-223775 A | 12/2017 |

(Continued)

OTHER PUBLICATIONS

International Search Report and Written Opinion of PCT Application No. PCT/JP2021/004339, issued on Apr. 27, 2021, 09 pages of ISRWO.

*Primary Examiner* — Xanthia C Relford
(74) *Attorney, Agent, or Firm* — CHIP LAW GROUP

(57) ABSTRACT

A sensor module includes a housing, a board unit, an external connector, and a joining member. The housing includes a first case, and a second case that is welded to the first case. The board unit includes a sensor element, and is arranged in the housing. The external connector is provided to the second case, and includes an elastically deformable terminal that is electrically connected to the board unit. The joining member is mounted on the board unit and welded to the housing.

15 Claims, 13 Drawing Sheets

(56) References Cited

U.S. PATENT DOCUMENTS

| | | | |
|---|---|---|---|
| 10,351,072 B2* | 7/2019 | Conger | B60R 11/04 |
| 10,649,205 B2* | 5/2020 | Choi | G03B 11/00 |
| 10,670,835 B2* | 6/2020 | Wei | G02B 7/022 |
| 10,715,708 B2* | 7/2020 | Kim | H04N 23/55 |
| 2012/0019940 A1 | 1/2012 | Lu et al. | |
| 2018/0098033 A1 | 4/2018 | Mleczko et al. | |
| 2019/0132954 A1* | 5/2019 | Kim | G03B 11/04 |
| 2019/0137724 A1* | 5/2019 | Kim | G02B 7/02 |
| 2019/0260918 A1* | 8/2019 | Kim | H04N 23/51 |
| 2019/0373142 A1* | 12/2019 | Fujiwara | H04N 23/54 |

FOREIGN PATENT DOCUMENTS

| | | |
|---|---|---|
| JP | 6415654 B1 | 10/2018 |
| JP | 2018-173431 A | 11/2018 |
| KR | 10-2018-0110992 A | 10/2018 |

* cited by examiner

SENSOR MODULE

CROSS REFERENCE TO RELATED APPLICATIONS

This application is a U.S. National Phase of International Patent Application No. PCT/JP2021/004339 filed on Feb. 5, 2021, which claims priority benefit of Japanese Patent Application No. JP 2020-020818 filed in the Japan Patent Office on Feb. 10, 2020. Each of the above-referenced applications is hereby incorporated herein by reference in its entirety.

TECHNICAL FIELD

The present technology relates to a sensor module mounted on, for example, a vehicle.

BACKGROUND ART

A camera apparatus that is mounted on a vehicle and used to perform visual recognition using a monitor apparatus placed near a cockpit has been provided in the past, in order to improve the convenience and the safety for the vehicle. This type of camera apparatus includes a substantially rectangular housing into which, for example, an imaging lens, an imaging device, and an external connector are incorporated, and the housing is built in or attached to, for example, a rear door, a sideview mirror, or a front spoiler of a vehicle body such that the imaging lens faces the outside. Such a camera apparatus makes it possible to capture an image of surroundings of a vehicle that are a blind spot as viewed from a driver, and thus to improve the safety and the convenience.

In this type of camera apparatus, there is a need to determine a position of an imaging device in a housing and to stably electrically connect an external connector and a board on which the imaging device is mounted, in order to acquire a high-quality image signal from the imaging device.

For example, Patent Literature 1 discloses a camera apparatus in which tolerances in a distance between an external connector and a board on which an imaging device is mounted are absorbed and thus a stable electrical connection between the external connector and the board is ensured by the external connector and the board being connected to each other using a flexible printed circuit (FPC). Further, the camera apparatus disclosed in Patent Literature 1 includes, in a housing, a shield case used to take electromagnetic-compatibility (EMC) measures, and a barrel (an imaging lens) is fixed in the housing using a spring force of the shield case.

On the other hand, Patent Literature 2 discloses a method for fixing, to a housing, a board on which an imaging device is mounted, using a plurality of coupling pieces. Further, Patent Literature 3 discloses a technology that uses a floating connector to electrically connect an external connector and a board on which an imaging device is mounted.

CITATION LIST

Patent Literature

Patent Literature 1: Japanese Patent No. 5413231
Patent Literature 2: Japanese Patent Application Laid-open No. 2018-173431
Patent Literature 3: Japanese Patent No. 6415654

DISCLOSURE OF INVENTION

Technical Problem

However, in the camera apparatus disclosed in Patent Literature 1, the use of an FPC results in an increase in costs, and the signal quality is reduced due to redundant wiring. Further, in the case of a camera apparatus in which there is no need for a shield case due to a board that provides a relatively good performance in EMC being used, there is a need for a separate fixation mechanism that serves to support a barrel.

Further, when the method for fixing a board to a housing using a plurality of coupling pieces such as screws, as described in Patent Literature 2, is adopted, this results in an increase in number of components and a reduction in the efficiency in operation. Further, this may result in breaking up a component around a screw hole upon fastening a screw. Further, when the method using a floating connector, as described in Patent Literature 3, is adopted, this results in using an expensive component, and may further result in an unstable connection between a board and an external connector. Those are not favorable from the viewpoint of the EMC and the signal quality.

In view of the circumstances described above, it is an object of the present technology to provide a sensor module that makes it possible to ensure a stable electrical connection between an imaging device and an external connector while reducing component costs.

Solution to Problem

A sensor module according to the present technology includes a housing, a board unit, an external connector, and a joining member.

The housing includes a first case, and a second case that is welded to the first case.

The board unit includes a sensor element, and is arranged in the housing.

The external connector is provided to the second case, and includes an elastically deformable terminal that is electrically connected to the board unit.

The joining member is mounted on the board unit and welded to the housing.

In the sensor module, the board unit and the housing are joined to each other using the joining member mounted on the board unit. This results in there being no need for members, such as a screw and a spring, that are used to fix the board unit to the housing. Further, the external connector includes an elastically deformable terminal. This results in the board unit and the external connector being stably connected to each other without being affected by tolerances. This makes it possible to reduce the number of components and to prevent the signal quality from being reduced.

The board unit may include a first board that includes a first surface that supports the sensor element, a second board that includes a second surface that supports the joining member, and a board connector that connects the first board and the second board.

The second surface may be a surface that faces the second case. In this case, the joining member is welded to the second case.

The first case and the joining member may be made of a synthetic-resin material that has absorptive properties with respect to laser light of a specified wavelength. In this case, the second case is made of a synthetic-resin material that has transmissive properties with respect to the laser light.

Alternatively, the first case and the joining member may be made of a synthetic-resin material that has transmissive properties with respect to laser light of a specified wavelength. In this case, the second case is made of a synthetic-resin material that has absorptive properties with respect to the laser light.

On the other hand, the second surface may be a surface that faces the first board. In this case, the joining member is welded to the first case.

The first case may be made of a synthetic-resin material that has transmissive properties with respect to laser light of a specified wavelength. In this case, the second case and the joining member are made of a synthetic-resin material that has absorptive properties with respect to the laser light.

Alternatively, the first case may be made of a synthetic-resin material that has absorptive properties with respect to laser light of a specified wavelength. In this case, the second case and the joining member are made of a synthetic-resin material that has transmissive properties with respect to the laser light.

Alternatively, the second surface may be a surface that faces the second case. In this case, the joining member is welded to the first case.

The first case may be made of a synthetic-resin material that has absorptive properties with respect to laser light of a specified wavelength. In this case, the second case and the joining member are made of a synthetic-resin material that has transmissive properties with respect to the laser light.

On the other hand, the second surface may be a surface that faces the first board. In this case, the joining member is welded to the second case.

The first case and the joining member may be made of a synthetic-resin material that has transmissive properties with respect to laser light of a specified wavelength. In this case, the second case is made of a synthetic-resin material that has absorptive properties with respect to the laser light.

The sensor element may be a solid-state imaging device. In this case, the housing further includes a barrel member that includes a barrel and a joining portion, the barrel being fitted into the first case, the joining portion being joined to the first surface.

The sensor element may be a solid-state imaging device. In this case, the first case includes a barrel, and a joining portion that is joined to the first surface.

The joining member may include a plurality of block materials arranged in a peripheral region of the second surface.

The joining member may be an annular member that is arranged in a peripheral region of the second surface.

BRIEF DESCRIPTION OF DRAWINGS

FIG. 4A is a plan view, FIG. 4B is a front view, and FIG. 4C is a side view.

MODE(S) FOR CARRYING OUT THE INVENTION

Embodiments according to the present technology will now be described below with reference to the drawings.

First Embodiment

[Configuration of Sensor Module]

Figure 1:
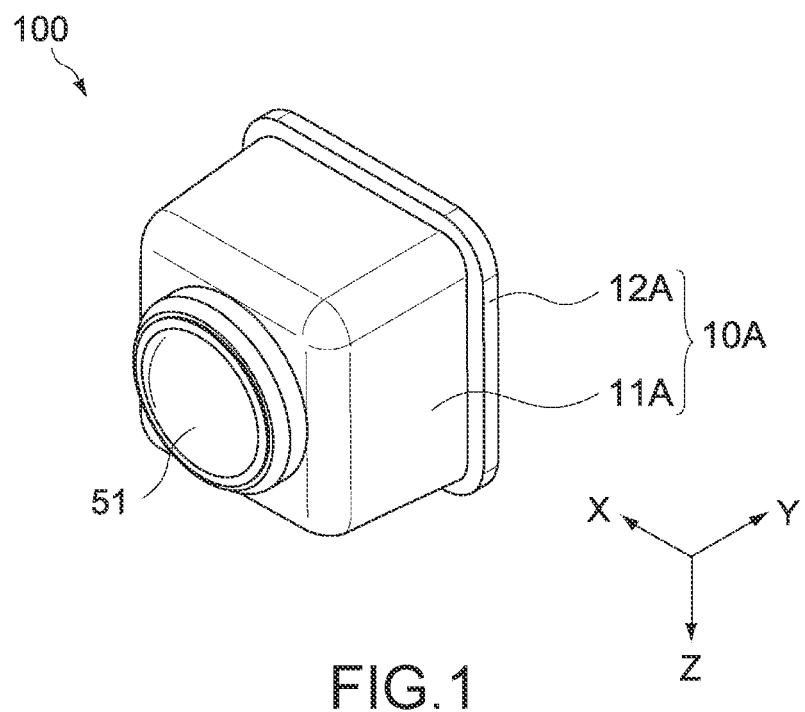
FIG. 1 is a perspective view of a sensor module according to a first embodiment of the present technology.
Figure 2:
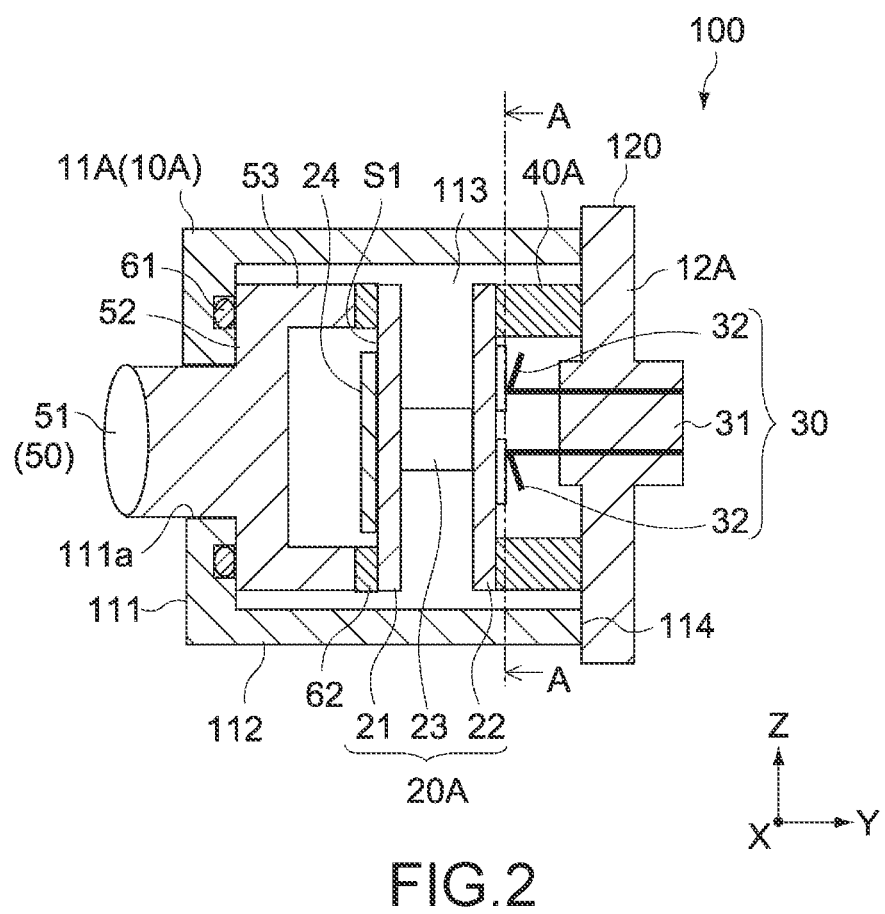
FIG. 2 is a schematic cross-sectional side view illustrating a configuration of the inside of the sensor module.
Figure 3:
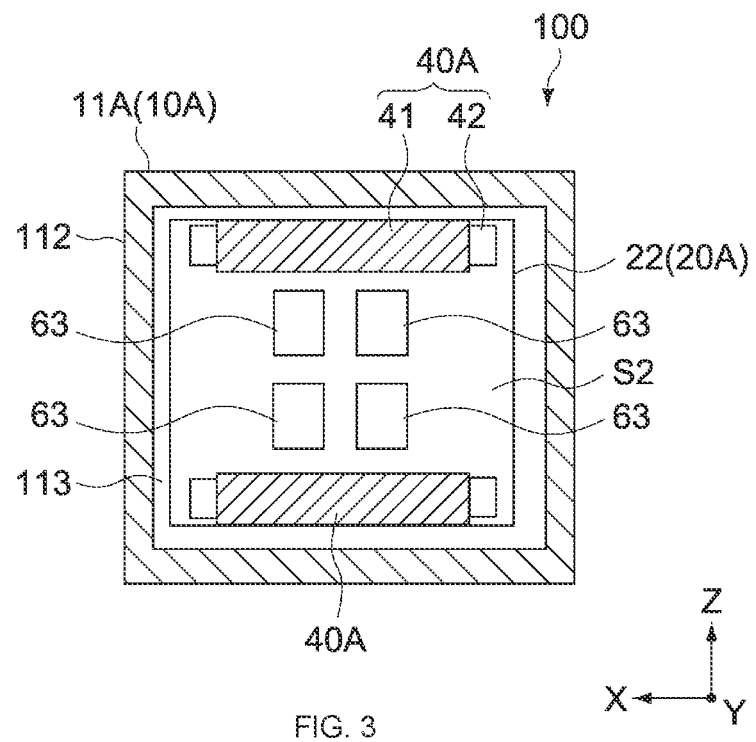
FIG. 3 is a cross-sectional view along the line A-A in FIG. 2.

FIG. 1 is a perspective view of a sensor module 100 according to a first embodiment of the present technology, FIG. 2 is a schematic cross-sectional side view illustrating a configuration of the inside of the sensor module 100, and FIG. 3 is a cross-sectional view along the line A-A in FIG. 2.

In the present embodiment, an example in which a camera module used by being mounted on a vehicle is applied as the sensor module, is described. In each figure, an X axis, a Y axis and a Z axis respectively represent directions of three axes that are orthogonal to each other, and a Y-axis direction corresponds to an optical-axis direction.

The sensor module 100 includes a housing 10A, a board unit 20A, an external connector 30, and a joining member 40A.

For example, the sensor module 100 is arranged outside of a vehicle body (an attachment target) (not illustrated), and captures an image of a region situated ahead of a vehicle, an image of a region situated behind the vehicle, or a region on a lateral side of the vehicle depending on an attachment position.

For example, the sensor module 100 attached to a front portion (for example, a radiator grill) of the vehicle body captures an image of an environment ahead of the vehicle. Further, the sensor module 100 attached to a rear portion (for example, above a license plate) of the vehicle body captures an image of an environment behind the vehicle. Furthermore, the sensor module 100 attached to a side of the vehicle (for example, an upper portion of a pillar (an A-pillar, a B-pillar, or a pillar (a C-pillar, a D-pillar) situated in a rearmost portion of the vehicle, or a sideview mirror) captures an image of an environment in a lateral direction of the vehicle.

(Housing)

The housing 10A includes a front case 11A that is a first case, and a rear case 12A that is a second case and is welded to the front case 11A.

The front case 11A includes a front surface portion 111 that is formed substantially orthogonal to a front-rear direction (the Y-axis direction), and a lateral surface portion 112 that extends toward the rear case 12A from a peripheral edge of the front surface portion 111.

In the present embodiment, the front surface portion 111 is substantially rectangular as viewed from the Y-axis direction. The front case 11A is hollow, and a space portion 113 is formed in a region surrounded by the front surface portion 111 and the lateral surface portion 112. At an end of the lateral surface portion 112 that is situated on the side of the rear case 12A, the front case 11A includes an opening end 114 at which a welding portion in which the front case 11A is welded to the rear case 12A is formed. The opening end 114 and the front surface portion 111 are not limited to being rectangular, and may be formed into any shape, such as a circular shape or a triangular shape.

The rear case 12A is in the form of a flat plate that is arranged substantially orthogonal to the Y direction. The rear case 12A is formed into a shape that corresponds to the shape of the front surface portion 111 of the front case 11A, and is formed to be substantially rectangular in the present embodiment. The rear case 12A is welded to the opening end 114 of the front case 11A to close the space portion 113. The rear case 12A is formed to have a larger area than the front surface portion 111 such that a peripheral edge 120 of the rear case 12A extends outward on the side of an outer periphery of the opening end 114 of the front case 11. Without being limited thereto, the rear case 12A may be formed to have the same area as the front surface portion 111.

Typically, the front case 11A and the rear case 12A are injection-molded bodies made of a synthetic-resin material. A method for joining the front case 11A and the rear case 12A is not particularly limited, and any welding method such as ultrasonic welding or laser welding can be adopted. In the present embodiment, laser welding is adopted to join the front case 11A and the rear case 12A. This will be described later.

In the present embodiment, the housing 10A further includes a barrel member 50. The barrel member 50 includes a barrel 51, a flange 52, and a leg portion 53 that is a joining portion.

The barrel 51 supports at least one imaging lenses, and is formed into a substantially cylindrical shape that has an axis parallel to the Y-axis direction. The barrel 51 is fitted into a through-hole 111a that is formed in a middle portion of the front surface portion 111 of the front case 11.

The flange 52 is integrally formed at an end of the barrel 51 that is situated on the side of the rear case 12A, and is an annular portion that protrudes toward an inner surface of the lateral surface portion 112 of the front case 11. The flange 52 is brought into contact with an inner surface of the front portion 111 of the front case 11 through a seal ring 61. Consequently, adhesion between the front case 11 and the barrel member 53 is improved, and this results in ensuring waterproof properties and dustproof properties.

The leg portion 53 is a cylindrical portion that protrudes toward the rear case 12A from a peripheral edge of the flange 52. An end of the leg portion 53 is joined to a first board 21 of the board unit 20A through an adhesive layer 62 that is an object obtained by hardening an adhesive.

(Board Unit)

The board unit 20A is arranged in the housing 10A, and includes a first board 21, a second board 22, a board connector 23, and an imaging device 24 that is a sensor element.

Typically, the first board 21 and the second board 22 are rigid, rectangular double-sided circuit boards such as glass epoxy boards. In the present embodiment, the first board 21 and the second board are formed to have the same size as each other, and are arranged in the housing 10A to be parallel to a plane (an XZ plane) that is orthogonal to the Y-axis direction.

The first board 21 includes a front surface (a first surface S1) that supports the imaging device 24, and a back surface that is situated opposite to the front surface. The front surface (the first surface S1) of the first board 21 is a surface that faces the barrel member 50, and the back surface of the first board 21 is a surface that is connected to the board connector 23. A peripheral edge of the first surface S1 is joined to the leg portion 53 of the barrel member 50 through the adhesive layer 62.

The imaging device 24 is a solid-state imaging device or an image sensor of, for example, a complementary metal-oxide semiconductor (CMOS) or a charge coupled device (CCD). The imaging device 24 is arranged in a middle portion of the first surface S1 that is situated on an optical axis of the barrel 51. The imaging device 24 is arranged at a position at which a pencil of light of a subject that passes through the barrel 51 is imaged. A distance between the imaging device 24 and the barrel 51 is adjusted by, for example, a length of the leg portion 53 or a thickness of the adhesive layer 62.

The second board 22 includes a front surface that is connected to the board connector 23, and a back surface that faces the rear case 12A. A plurality of electrodes 63 electrically connected to the external connector 30 is provided to a middle portion of the back surface of the second board 22 (refer to FIG. 3). The plurality of electrodes 63 is electrically connected to the imaging device 24 through the second board 22, the board connector 23, and the first board 21, and includes a signal line and a ground (GND) line.

The board connector 23 is a B-to-B connector that mechanically and electrically connects the first board 21 and the second board 22. For example, the board connector 23 has a structure for coupling an inner-insertion-side connector portion that is mounted on the back surface of the first board 21 and an outer-insertion-side connector portion that is mounted on the front surface of the second board 22. A relative distance between the first board 21 and the second board 22 in the Y-axis direction is defined by the board connector 23. Peripheral components such as a drive circuit that drives the imaging device 24, and a signal processing circuit that processes an output signal of the imaging device 24 are mounted on each of the first board 21 and the second board 22, although this is not illustrated.

(External Connector)

The external connector 30 is used to electrically connect the board unit 2 and a vehicle body. Through the external connector 30, power is supplied from the vehicle body to the board unit 20A, and an image signal (an output signal of the imaging device 24) is transmitted from the board unit 20A to the vehicle body.

The external connector 30 includes a body 31 that is provided to the rear case 12A, and a plurality of elastically deformable terminals 32 electrically connected to the board unit 20A. The body 31 is provided to a middle portion of the rear case 12A to face the plurality of electrodes 63 provided to the back surface of the second board 22. The body 31 includes, for example, a coaxial cable that includes a signal line and a shield line that is concentric with the signal line.

The terminals 32 of the plurality of terminals 32 are arranged correspondingly to the respective electrodes 63. One of ends of each of the plurality of terminals 32 is supported by the body 31, and another of the ends is in contact with a corresponding one of the plurality of electrodes 63. A portion of the plurality of terminals 32 is connected to the signal line of the body 31, and another portion of the plurality of terminals 32 is connected to the shield line of the body 31. Each terminal 32 is made of a spring material that includes, for example, a bent portion elastically deformable in the Y-axis direction, and this results in the terminal 32 being brought into elastic contact with the electrode 63 to bias the board unit 20A toward the barrel member 50.

(Joining Member)

The joining member 40A is mounted on the board unit 20A and welded to the housing 10A. The joining member 40A is mounted on a second surface S2 of the second board 22. In the present embodiment, the second surface S2 is the back surface being included in the second board 22 and facing the rear case 12A. The joining member 40A is mounted on a peripheral edge of the second surface S2 and welded to the rear case 12A.

Figure 4A:
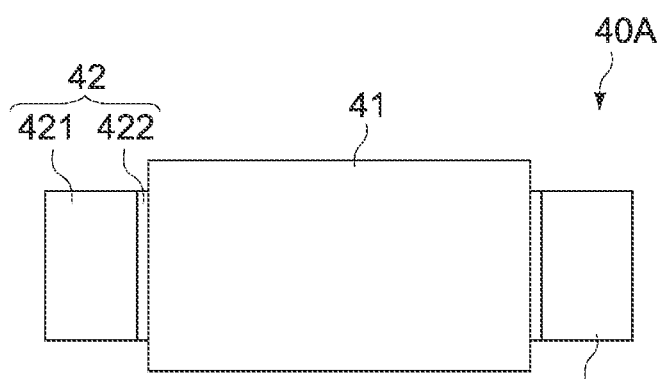
FIGS. 4A, 4B, and 4C are general views illustrating an example of a configuration of a joining member included in the sensor module, where
Figure 4B:
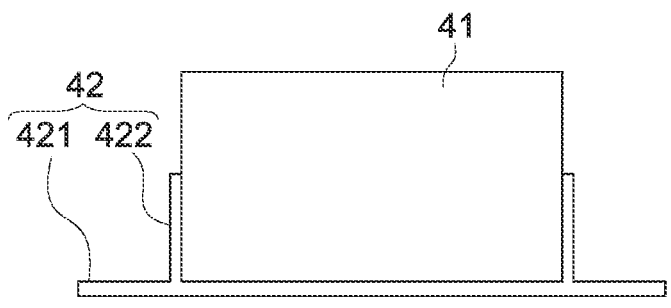
Figure 4C:
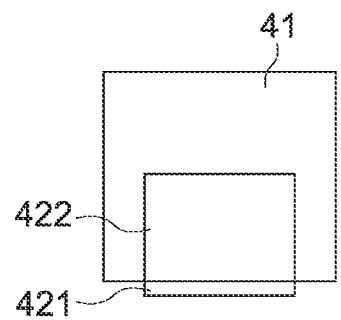

FIGS. 4A, 4B, and 4C are general views illustrating an example of a configuration of the joining member 40A, where FIG. 4A is a plan view as viewed from the Y-axis direction, FIG. 4B is a front view as viewed from the Z-axis direction, and FIG. 4C is a side view as viewed from the X-axis direction. The joining member 40A includes a resinous block 41, and a base 42 that fixes the block 41 to the second surface S2.

The block 41 is a synthetic-resin block material that has absorptive properties with respect to laser light of a specified wavelength, which will be described later. A shape of the block 41 is not particularly limited, and the block 41 may be formed into any shape such as a cylindrical shape or a prismatic shape in addition to the rectangular-parallelepiped shape illustrated in the figure.

The base 42 is made of a metallic material such as stainless steel or an aluminum alloy. The shape of the base 42 is not particularly limited. In the present embodiment, the base 42 includes a strip-shaped plate 421 that supports a bottom of the block 41, and a pair of walls 422 respectively supporting two sides of the block 41. The plate 421 is joined to the second surface S2 of the second board 22 using soldering. Nickel plating or tin plating may be performed on the surface of the plate 421, in order to increase the wettability of a solder.

Without being limited to using soldering, the base 42 may be joined to the second board 22 using, for example, an adhesive. In this case, the base 42 may be omitted, and the block 41 may be directly joined to the second board 22.

With respect to a height (thickness) dimension of the joining member 40A in the Y-axis direction, the joining member 40A is formed to have a height greater than or equal to a height that corresponds to a distance between the back surface (the second surface S2) of the second board 22 and an inner surface of the rear case 12A. As will be described later, a contact surface of the block 41 that is brought into contact with the rear case 12A is partially melted upon laser welding. Thus, the height of the block 41 is set according to an amount of the melted block 41.

Figure 5:
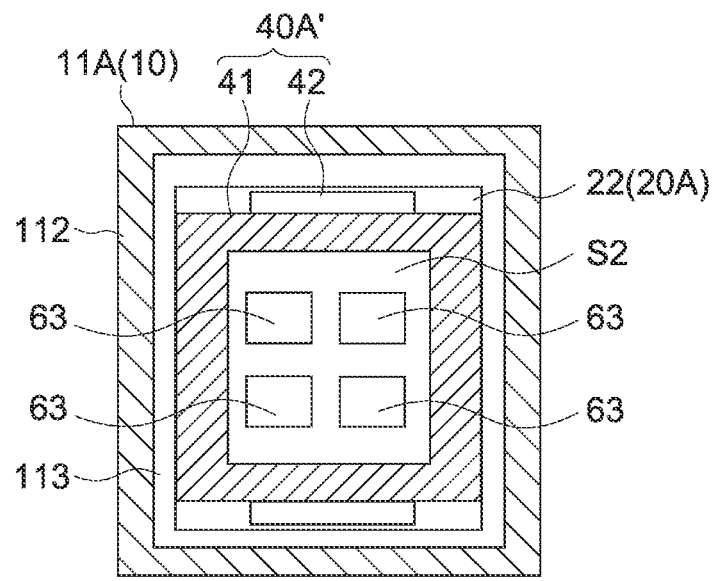
FIG. 5 is a cross-sectional view of a modification of the sensor module.

The number of joining members 40A and a position at which the joining member 40A is mounted are not particularly limited, and the joining member 40A is typically arranged at a plurality of positions around the plurality of electrodes 63. In the present embodiment, two joining members 40A are mounted along two sides of the shape of the second board 22 that are parallel to the X-axis direction, such that the plurality of electrodes 63 is situated between the two joining members 40A. The number of joining members 40A is not limited to two, and may be three or more. Alternatively, a rectangularly annular single joining member 40A' that surrounds the plurality of electrodes 63 may be used, as illustrated in FIG. 5.

In the present embodiment, the rear case 12A is joined to the front case 11A and the joining member 40A using laser welding. In the present embodiment, the front case 11A and the joining member 40A are made of a resin material that has absorptive properties with respect to laser light of a specified wavelength. Further, the rear case 12A is made of a resin material that has transmissive properties with respect to the laser light of the specified wavelength.

For example, a general-purpose resin such as an acrylonitrile-styrene (AS) resin or an acrylonitrile-butadiene-styrene (ABS) resin, a polycarbonate (PC) resin, a mixture resin of ABS and PC, a polyamide (PA) resin, or a polybutylene terephthalate (PBT) resin is used as a resin material that has absorptive properties or transmissive properties with respect to laser light.

The absorptive properties or the transmissive properties with respect to laser light can be adjusted by, for example, an amount of a laser-absorptive material that is mixed with a resin. For example, carbon black can be used as the laser-absorptive material. The adjustment of an amount of the laser-absorptive material added makes it possible to adjust the laser-light absorptance (or the laser-light transmittance) discretionarily. Note that it is favorable that the same type of matrix resin be used for a resin material having absorptive properties with respect to laser light and a resin material having transmissive properties with respect to the laser light. This results in increasing an affinity between resins situated at a joining portion and in enhancing the weld strength. Further, a change in a thickness of a resin makes it possible to adjust the transmittance. When the thickness of a resin is made larger, this makes it possible to further decrease the transmittance of the resin.

In the present embodiment, for example, red laser light of a wavelength of from 800 nm to 1100 nm is used as laser light used for welding. With respect to a resin material having transmissive properties with respect to laser light, the transmittance of the resin material with respect to the laser light is greater than or equal to 30%, and favorably greater than or equal to 40%.

[Method for Producing Sensor Module]

Next, a method for producing the sensor module 100 having the configuration described above is described.

The method for producing the sensor module 100 according to the present embodiment includes accommodating, in the front case 11A, the board unit 20A including a sensor element (the imaging device 24), joining the rear case 12A to the opening end 114 of the front case 11A using laser welding, and joining the rear case 12A to the joining member 40A mounted on the back surface (the second surface S2) of the board unit 20A using laser welding.

Figure 6:
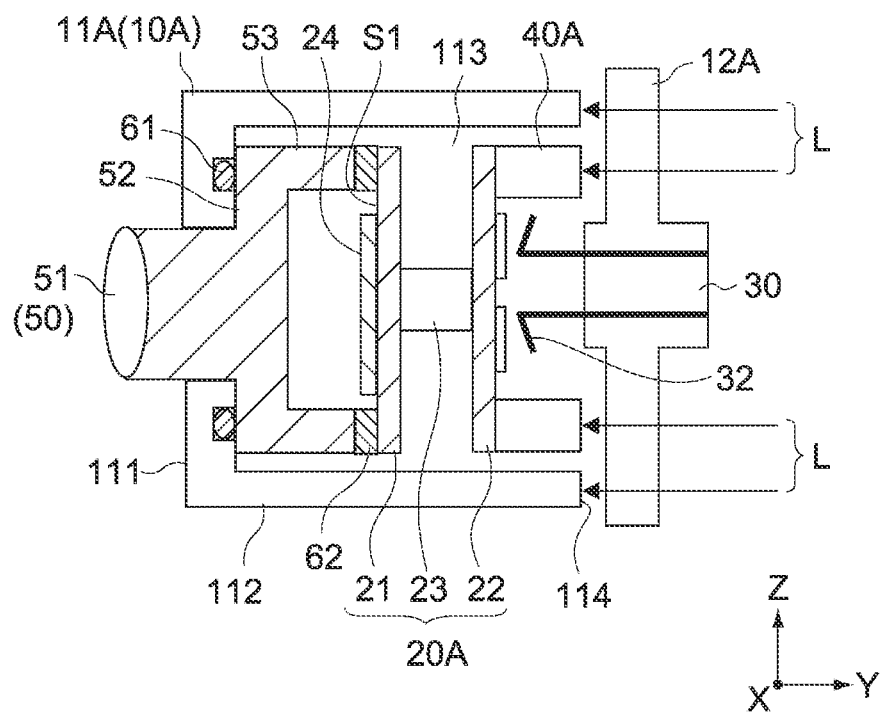
FIG. 6 is a schematic process diagram used to describe a method for producing the sensor module.

FIG. 6 is a schematic process diagram used to describe the method for producing the sensor module 100.

First, the first board 21 on which the imaging device 24 is mounted and the second board 22 on which the joining member 40A is mounted are connected to each other through the board connector 23 to assemble the board unit 20A. Next, through the adhesive layer 62, the leg portion 53 of the barrel member 50 is joined to the front surface (the first surface S1) of the first board 21 on which the imaging device 24 is mounted to integrate the barrel member 50 and the board unit 20A. Then, the seal ring 61 is attached to the inner surface of the front surface portion 111 of the front case 11A, and the board unit 20A with the barrel member 50 is inserted into the space portion 113 of the front case 11A to fit the barrel 51 into the through-hole 111a of the front surface portion 111.

Next, the rear case 12A is arranged to face the opening end 114 of the front case 11A. Then, the rear case 12A is pressed against the front case 11A under a specified load to bring a plurality of terminals 32 of the external connector 30 into elastic contact with a plurality of electrodes 63 situated on the second board 22 of the board unit 20A. In this state, laser light L used for welding is irradiated onto the opening end 114 of the front case 11A and the joining member 40A from the side of a back surface of the rear case 12A. An irradiation direction is a direction of an arrow of the laser light L in FIG. 6. Here, the laser light L is transmitted through a resin layer of the rear case 12A to be irradiated onto a portion, in the front case 11A, that corresponds to the opening end 114, and onto the block 41 of the joining member 40A.

The laser light L may be pulsed light or continuous light. Different laser beams are used as the laser light L irradiated onto the opening end 114 of the front case 11A and the laser light L irradiated onto the joining member 40A. In this case, the laser light L irradiated onto the opening end 114 and the laser light L irradiated onto the joining member 40A may be irradiated at the same time, or one of the pieces of laser light L may be irradiated after another of the pieces of laser light L is irradiated.

Sealing properties of a portion between the front case 11A and the rear case 12A are improved by laser light L irradiated onto the opening end 114 being scanned over the entirety of the opening end 114, and this results in ensuring waterproof properties or dustproof properties. Instead, the laser light L may be irradiated onto a plurality of positions at the opening end 114 in the form of spots. Likewise, the laser light L irradiated onto the joining member 40A may be scanned in a longitudinal direction of the joining member 40A, or may be irradiated onto a plurality of positions in the joining member 40A in the form of spots.

In the present embodiment, the front case 11A and the block 41 of the joining member 40A are made of a resin material that has absorptive properties with respect to the laser light L, and the rear case 12A is made of a resin material that has transmissive properties with respect to the laser light L. Thus, the laser light L is transmitted through the rear case 12A to be irradiated onto the opening end 114 of the front case 11A and the joining member 40A.

Regions, in the opening end 114 and the joining member 40A, that are each irradiated with the laser light L each generate heat due to absorption of the laser light L to be partially melted. On the other hand, a front surface of the rear case 12A that faces the opening end 114 and the joining member 40A is also partially melted due to heat transfer from melted portions of the opening end 114 and the joining member 40A. Thereafter, the melted portion of the front case 11A, the melted portion of the joining member 40A, and a melted portion of the rear case 12A are cooled to be solidified, and the welding portion welded to the opening end 114 of the front case 11A and a welding portion welded to the joining member 40A are formed on the rear case 12A. Accordingly, the front case 11A, the board unit 20A, and the rear case 12 are integrally joined to each other to produce the sensor module 100.

As described above, the rear case 12A is welded to the front case 11A and the board unit 20A using laser welding. Thus, according to the present embodiment, there is no need to provide a space for a screw hollow and to perform attachment with a screw for packing, compared to when a rear case and a front case are joined to each other using a screw or the front case and the rear case are joined to each other using a screw. This makes it possible to improve a degree of freedom in design, to facilitate the operation, and to reduce costs by reducing the number of screw components. Further, the sensor module 100 can be made smaller in size since there is no need for a space for a screw hollow. Furthermore, a high-functionality large component (LSI) can be implemented since the internal space of the sensor module 100 is made larger. This makes it possible to raise the functionality of the sensor module 100.

Further, according to the present embodiment, tolerances between the housing 10A and the board unit 20A are absorbed by the block 41 of the joining member 40A being melted upon laser welding. Further, tolerances between the board unit 20A and the external connector 30 are absorbed by a plurality of terminals 32 of the external connector 30 being brought into elastic contact with a plurality of electrodes 63 situated on the board unit 20A. This makes it possible to ensure the reliability in a stable electrical connection between the board unit 20A and the external connector 30. Furthermore, a wiring length can be made smaller, compared to when the board unit and the external connector are connected to each other through an FPC. This prevents a degradation of an image signal output from the imaging device 24.

Second Embodiment

Figure 7:
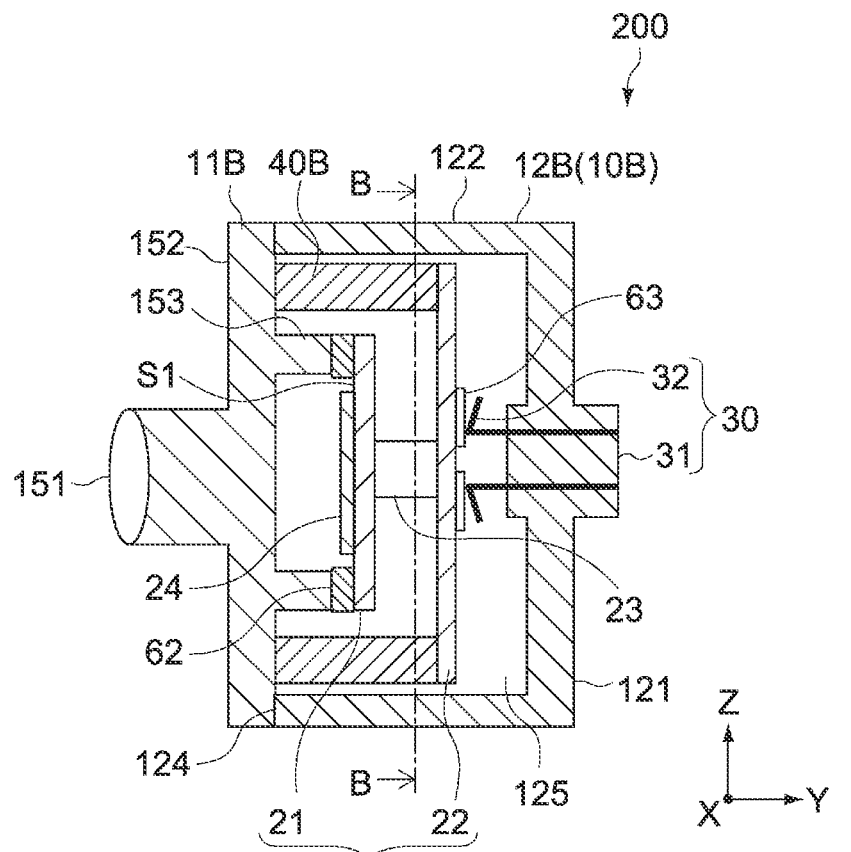
FIG. 7 is a schematic cross-sectional side view illustrating a configuration of a sensor module according to a second embodiment of the present technology.
Figure 8:
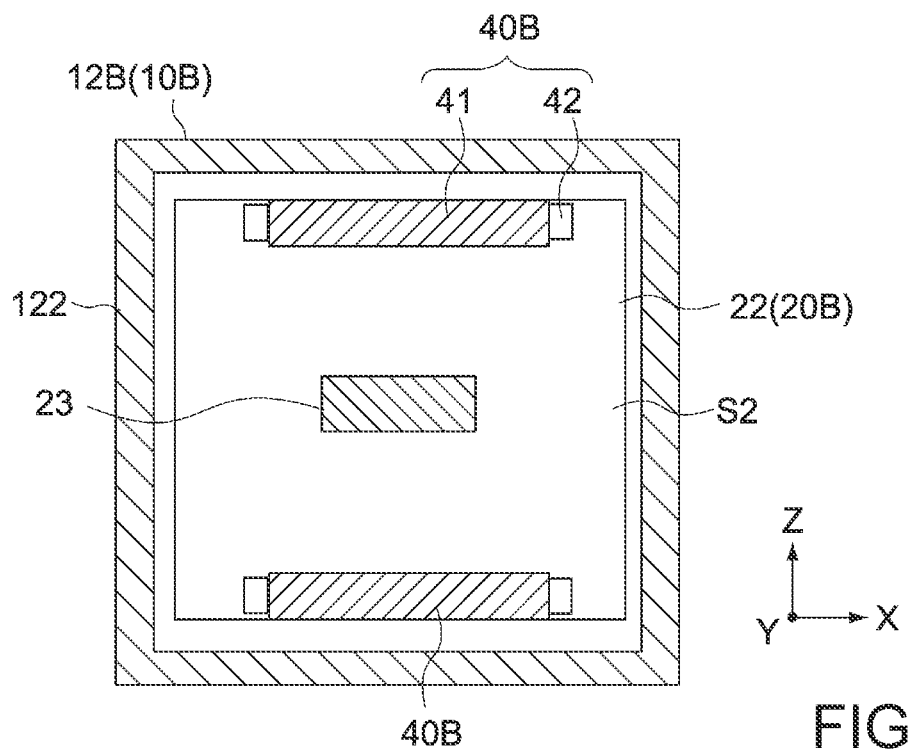
FIG. 8 is a cross-sectional view along the line B-B in FIG. 7.

FIG. 7 is a schematic cross-sectional side view illustrating a configuration of a sensor module 200 according to a second embodiment of the present technology, and FIG. 8 is a cross-sectional view along the line B-B in FIG. 7.

In the following description, a structural element that is different from the structural elements of the first embodiment is primarily described. A structural element similar to the structural element of the first embodiment is denoted by a reference numeral similar to the reference numeral used in the first embodiment, and a description thereof is omitted or simplified.

The sensor module 200 of the present embodiment includes a housing 10B, a board unit 20B, the external connector 30, and a joining member 40B.

The housing 10B includes a front case 11B that is a first case, and a rear case 12B that is a second case. The present embodiment is different from the first embodiment in that the front case 11B is rectangular in the form of an almost flat plate, and the rear case 12B has a shape of a substantially rectangular tube with a bottom.

The front case 11B includes a barrel 151, a flat plate portion 152, and a leg portion 153 that is a joining portion. The barrel 151 is integrally provided to a middle portion on a front surface of the flat plate portion 152. The leg portion 153 is provided to a middle portion on a back surface of the flat plate portion 152, and is a cylindrical portion that is formed concentrically with the barrel 151. The leg portion 153 has an inner diameter that is larger than an outer diameter of the barrel 151, and an end of the leg portion 153 is joined to the first board 21 of the board unit 20B through the adhesive layer 62.

The rear case 12B includes a bottom portion 121 to which the external connector 30 is provided, and a lateral surface portion 122 that extends toward the front case 11B from a peripheral edge of the bottom portion 121. The rear case 12B is hollow, and a space portion 123 is formed in a region surrounded by the bottom portion 121 and the lateral surface portion 122. At an end of the lateral surface portion 122 that is situated on the side of the front case 11B, the rear case 12B includes an opening end 124 at which a welding portion in which the rear case 12B is welded to the front case 11B is formed. The opening end 124 is welded to the flat plate portion 152 of the front case 11B to close the space portion 123. The flat plate portion 152, the bottom portion 121, and the opening end 124 are not limited to being rectangular, and may be formed into any shape, such as a circular shape or a triangular shape.

Typically, the front case 11B and the rear case 12B are injection-molded bodies made of a synthetic-resin material. A method for joining the front case 11B and the rear case 12B is not particularly limited, and any welding method such as ultrasonic welding or laser welding can be adopted. In the present embodiment, laser welding is adopted to join the front case 11B and the rear case 12B. This will be described later.

As in the first embodiment, the board unit 20B includes the first board 21, the second board 22, the board connector 23, and the imaging device 24 that is a sensor element.

Typically, the first board 21 and the second board 22 are rigid, rectangular double-sided circuit boards such as glass epoxy boards. In the present embodiment, the second board 22 is formed to have a larger area than the first board 21, and is arranged in the housing 10B to be parallel to a plane (the XZ plane) that is orthogonal to the Y-axis direction.

The first board 21 includes the front surface (a first surface S1) supporting the imaging device 24, and the back surface situated opposite to the front surface. The front surface (the first surface S1) of the first board 21 is a surface that faces the barrel member 151, and the back surface of the first board 21 is a surface that is connected to the board connector 23. The peripheral edge of the first surface S1 is joined to the leg portion 153 of the front case 11B through the adhesive layer 62.

The imaging device 24 is arranged in a middle portion of the first surface S1 that is situated on an optical axis of the barrel 151. The imaging device 24 is arranged at a position at which a pencil of light of a subject that passes through the barrel 151 is imaged. A distance between the imaging device 24 and the barrel 151 is adjusted by a length of the leg portion 153 or a thickness of the adhesive layer 62.

The second board 22 includes the front surface connected to the board connector 23, and the back surface facing the rear case 12B. A plurality of electrodes 63 electrically connected to the external connector 30 is provided to a middle portion of the back surface of the second board 22. The plurality of electrodes 63 is electrically connected to the imaging device 24 through the second board 22, the board connector 23, and the first board 21, and includes a signal line and a ground (GND) line.

The external connector 30 includes the body 31 provided to the rear case 12B, and a plurality of elastically deformable terminals 32 electrically connected to the board unit 20B. The body 31 is provided to a middle portion of the bottom portion 121 of the rear case 12B to face the plurality of electrodes 63 provided to the back surface of the second board 22. The body 31 includes, for example, a coaxial cable that includes a signal line and a shield line that is concentric with the signal line. The terminal 32 and the electrode 63 respectively have configurations similar to their configurations in the first embodiment.

The joining member 40B is mounted on the board unit 20B and welded to the housing 10B. The joining member 40B is mounted on a second surface S2 of the second board 22. In the present embodiment, the second surface S2 is the front surface being included in the second board 22 and facing the first board 21. The joining member 40B is mounted on a peripheral edge of the second surface S2 and welded to the front case 11B. In other words, the joining member 40B can be welded to the front case 11B of the first board 21 since the peripheral edge of the second board 22 protrudes further outward than the peripheral edge of the first board 21 in the present embodiment.

As illustrated in FIG. 8, the joining member 40B includes the resinous block 41, and the base 42 fixing the block 41 to the second surface S2. The block 41 is a synthetic-resin material that has absorptive properties with respect to laser light of a specified wavelength, as in the first embodiment. A shape of the block 41 is not particularly limited, and the block 41 may be formed into any shape such as a cylindrical shape or a prismatic shape in addition to the rectangular-parallelepiped shape illustrated in the figure. The base 42 has a configuration similar to its configuration in the first embodiment.

With respect to a height (thickness) dimension of the joining member 40B in the Y-axis direction, the joining member 40B is formed to have a height greater than or equal to a height that corresponds to a distance between the front surface (the second surface S2) of the second board 22 and an inner surface (the back surface of the flat plate portion 152) of the front case 11B. As will be described later, a contact surface of the block 41 that is brought into contact with the front case 11B is partially melted upon laser welding. Thus, the height of the block 41 is set according to an amount of the melted block 41.

The number of joining members 40B and a position at which the joining member 40B is mounted are not particularly limited, and, in the present embodiment, two joining members 40A are mounted along two sides of the shape of the second board 22 that are parallel to the X-axis direction, such that the first board 21 is situated between the two joining members 40A. The number of joining members 40A is not limited to two, and may be three or more, or the joining member 40A may be formed into a rectangularly annular shape that surrounds the first board 21.

In the present embodiment, the front case 11B is joined to the rear case 12B and the joining member 40B using laser welding. In the present embodiment, the rear case 12B and the joining member 40B are made of a resin material that has absorptive properties with respect to laser light of a specified wavelength. Further, the front case 11B is made of a resin material that has transmissive properties with respect to the laser light of the specified wavelength.

In the present embodiment, for example, red laser light of a wavelength of from 800 nm to 1100 nm is used as laser light used for welding. The various resin materials described in the first embodiment may be adopted as resin materials having absorptive properties or transmissive properties with respect to laser light.

Figure 9A:
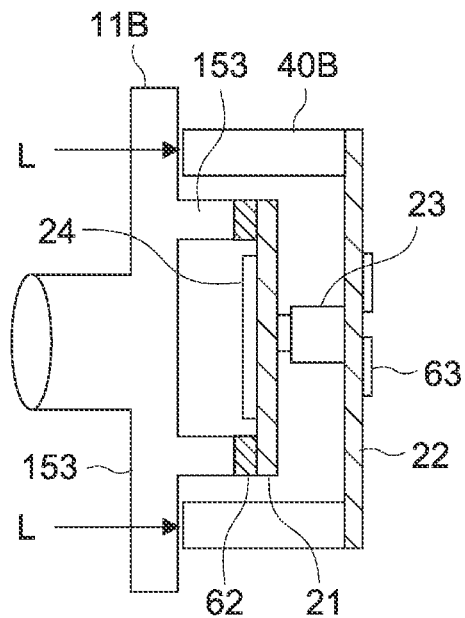
FIGS. 9A and 9B are sets of schematic cross-sectional side views used to describe a method for producing the sensor module.
Figure 9B:
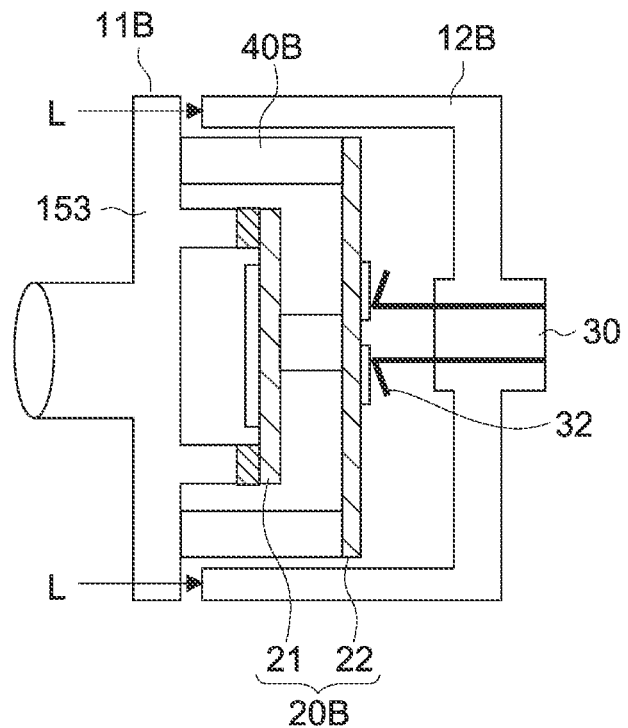

FIGS. 9A and 9B are schematic cross-sectional side views used to describe a method for producing the sensor module 200 having the configuration above according to the present embodiment.

First, the first board 21 on which the imaging device 24 is mounted and the second board 22 on which the joining member 40B is mounted are connected to each other through the board connector 23 to assemble the board unit 20B. Next, through the adhesive layer 62, the leg portion 153 of the front case 11B is joined to the front surface (the first surface S1) of the first board 21 on which the imaging device 24 is mounted to integrate the front case 11B and the board unit 20B.

Next, in a state in which the second board 22 is pressed against the front case 11B under a specified load, laser light L used for welding is irradiated onto the joining member 40B from the side of a front surface of the front case 11B, as illustrated in FIG. 9A. An irradiation direction is a direction of an arrow of the laser light L in FIG. 9A. Here, the laser light L is transmitted through a resin layer of the front case 11B to be irradiated onto the block 41 of the joining member 40A.

A region, in the joining member 40B, that is irradiated with the laser light L generates heat due to absorption of the laser light L to be partially melted. On the other hand, the flat plate portion 152 being included in the front case 11B and facing the joining member 40B is also partially melted due to heat transfer from a melted portion of the joining member 40B. Thereafter, the melted portion of the joining member 40B and a melted portion of the front case 11B are cooled to be solidified, and a welding portion welded to the joining member 40B is formed on the front case 11B.

Here, when the board connector 23 is in a semi-insertion state, this enables the second board 22 to approach the first board 21. This makes it possible to join the front case 11B and the joining member 40B properly.

Next, the front case 11B is arranged to face the opening end 124 of the rear case 12B, as illustrated in FIG. 9B. Then, the front case 11B is pressed against the rear case 12B under a specified load to bring a plurality of terminals 32 of the external connector 30 into elastic contact with a plurality of electrodes 63 situated on the second board 22 of the board unit 20B. In this state, laser light L used for welding is irradiated onto the opening end 124 of the rear case 12B from the side of the front surface of the front case 11B. An irradiation direction is a direction of an arrow of the laser light L in FIG. 9B. Here, the laser light L is transmitted through the resin layer of the front case 11B to be irradiated onto a portion, in the rear case 12B, that corresponds to the opening end 124.

A region, in the opening end 124 of the rear case 12B, that is irradiated with the laser light L generates heat due to absorption of the laser light L to be partially melted. On the other hand, the flat plate portion 152 being included in the front case 11B and facing the opening end 124 is also partially melted due to heat transfer from a melted portion of the opening end 124. Thereafter, the melted portion of the opening end 124 and a melted portion of the front case 11B are cooled to be solidified, and a welding portion welded to the rear case 12B is formed on the front case 11B. Accordingly, the front case 11B, the board unit 20B, and the rear case 12B are integrally joined to each other to produce the sensor module 200.

Effects similar to those described above can also be provided by the sensor module 200 having the configuration above according to the present embodiment. The present embodiment makes it possible to reduce the number of components and to make a length dimension of the housing 10B in the Y-axis direction, since the front case 11B also serves as a barrel member.

Note that an example of the configuration in which the front case 11B also includes a function as a barrel member has been described in the present embodiment. However, a barrel member separate from the front case may be used, as in the first embodiment. In this case, the joining member 40B is welded to the barrel member, and the rear case 12B is welded to the front case.

Third Embodiment

Figure 10:
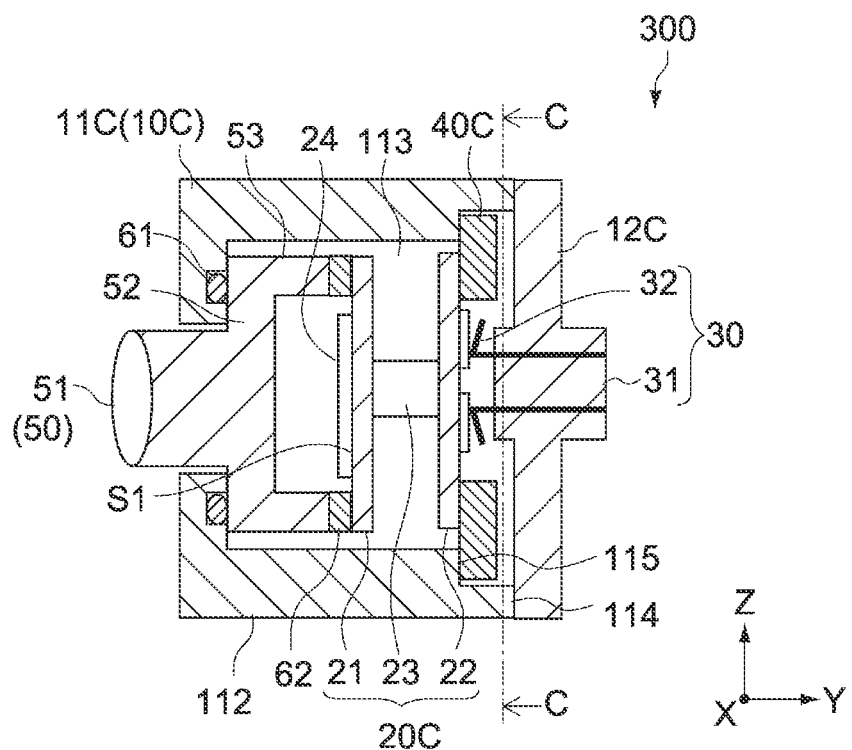
FIG. 10 is a schematic cross-sectional side view illustrating a configuration of a sensor module according to a third embodiment of the present technology.
Figure 11:
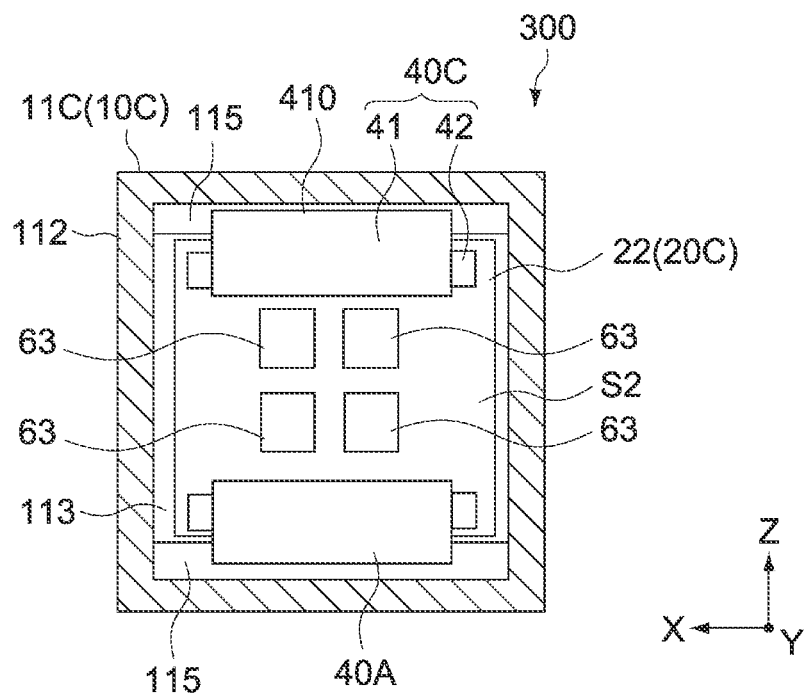
FIG. 11 is a cross-sectional view along the line C-C in FIG. 10.

FIG. 10 is a schematic cross-sectional side view illustrating a configuration of a sensor module 300 according to a third embodiment of the present technology, and FIG. 11 is a cross-sectional view along the line C-C in FIG. 10.

In the following description, a structural element that is different from the structural elements of the first embodiment is primarily described. A structural element similar to the structural element of the first embodiment is denoted by a reference numeral similar to the reference numeral used in the first embodiment, and a description thereof is omitted or simplified.

The sensor module 300 of the present embodiment includes a housing 10C, a board unit 20C, the external connector 30, and a joining member 40C.

The housing 10C includes a front case 11C that is a first case, a rear case 12C that is a second case, and the barrel member 50. The front case 11C and the rear case 12C respectively have configurations similar to the respective configurations of the front case 11A and the rear case 12A in the first embodiment. However, the present embodiment is different from the first embodiment in that a step portion 115 is provided to an inner surface of the opening end 114 of the front case 11C.

The board unit 20C includes the first board 21, the second board 22, and the board connector 23, and has a configuration similar to the configuration of the board unit 20A in the first embodiment. Since the same applies to the external connector 30, a description thereof is omitted.

The joining member 40C is mounted on the board unit 20C and welded to the housing 10C. The joining member 40C is mounted on a second surface S2 of the second board 22. In the present embodiment, the second surface S2 is the back surface being included in the second board 22 and facing the rear case 12C. As in the first embodiment, the joining member 40C includes the block 41 and the base 42, and is mounted on a peripheral edge of the second surface S2. In the present embodiment, the block 41 includes a protrusion 410 that corresponds to a portion of the block 41 that protrudes outward from the peripheral edge of the second board 22, and the protrusion 410 is welded to the step portion 115 of the front case 11C.

The step portion 115 of the front case 11C is provided to face the protrusion 410 of the joining member 40C, and, in the present embodiment, the step portion 115 is formed in a portion of the inner surface of the opening end 114 that is situated on the side of each of two sides of the shape of the opening end 114 that are parallel to the X-axis direction. The step portion 115 is formed at a depth that is greater than a height dimension of the joining member 40C in the Y-axis direction, and is formed to have a planar surface that can support the protrusion 410 of the joining member 40C. A width dimension of the step portion 115 in the Z-axis direction is not particularly limited, and it is sufficient if the step portion 115 has a width dimension that ensures a joining area with which a specified adhesion force is obtained between the step portion 115 and the protrusion 410 of the joining member 40C.

In the present embodiment, the rear case 12C and the joining member 40C are joined to the front case 11C using laser welding. In the present embodiment, the front case 11C is made of a resin material that has absorptive properties with respect to laser light of a specified wavelength. Further, the rear case 12C and the joining member 40C are made of a resin material that has transmissive properties with respect to the laser light of the specified wavelength. For example, red laser light of a wavelength of from 800 nm to 1100 nm is used as laser light used for welding. The various resin materials described in the first embodiment may be adopted as resin materials having absorptive properties or transmissive properties with respect to laser light.

Figure 12A:
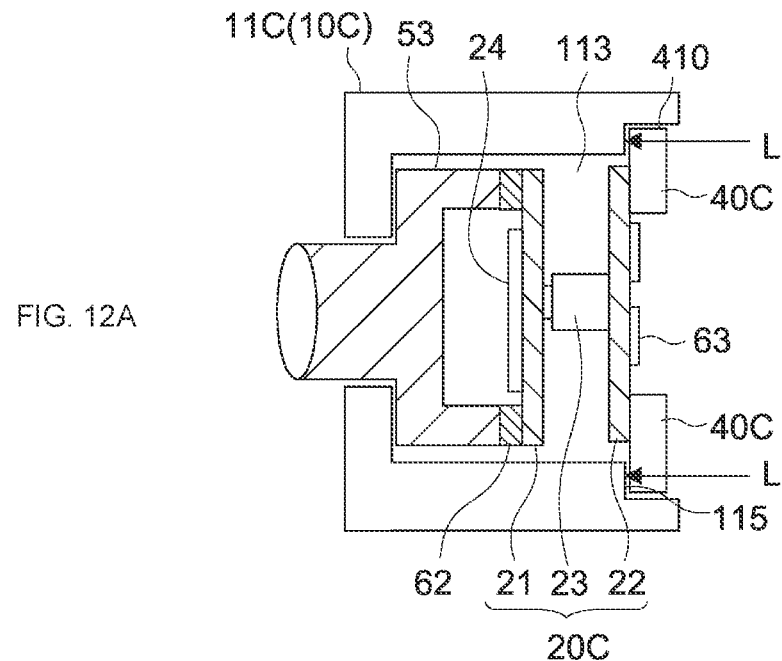
FIGS. 12A and 12B are sets of schematic cross-sectional side views used to describe a method for producing the sensor module.
Figure 12B:
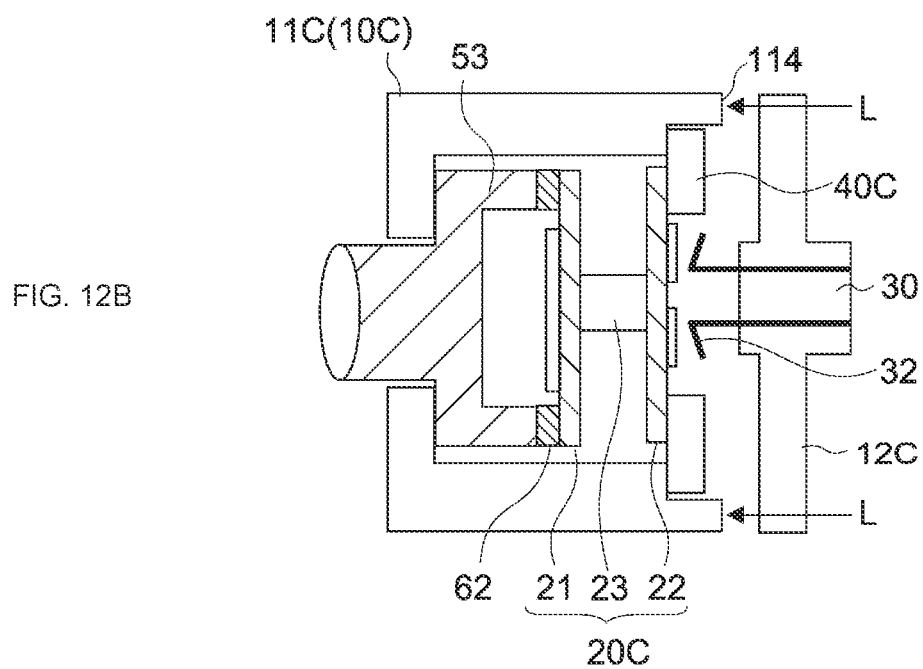

FIGS. 12A and 12B are schematic cross-sectional side views used to describe a method for producing the sensor module 300 having the configuration above according to the present embodiment.

First, the first board 21 on which the imaging device 24 is mounted and the second board 22 on which the joining member 40C is mounted are connected to each other through the board connector 23 to assemble the board unit 20C. Next, through the adhesive layer 62, the leg portion 53 of the barrel member 50 is joined to the front surface (the first surface S1) of the first board 21 on which the imaging device 24 is mounted to integrate the barrel member 50 and the board unit 20C. Then, the board unit 20C with the barrel member 50 is inserted into the space portion 113 of the front case 11C.

Next, in a state in which the second board 22 is pressed against the front case 11C under a specified load, laser light L used for welding is irradiated onto the protrusion 410 of the joining member 40C from the side of the back surface of the second board 22, as illustrated in FIG. 12A. An irradiation direction is a direction of an arrow of the laser light L in FIG. 12A. Here, the laser light L is transmitted through the protrusion 410 of the joining member 40C to be irradiated onto the step portion 115 of the front case 11C.

A region, in the step portion 115, that is irradiated with the laser light L generates heat due to absorption of the laser light L to be partially melted. On the other hand, the protrusion 410 being included in the joining member 40C and facing the step portion 115 is also partially melted due to heat transfer from a melted portion of the step portion 115. Thereafter, the melted portion of the step portion 115 and a melted portion of the protrusion 410 are cooled to be solidified, and a welding portion welded to the joining member 40C is formed on the front case 11C.

Here, when the board connector 23 is in a semi-insertion state, this enables the second board 22 to approach the first board 21. This makes it possible to join the front case 11C and the joining member 40C properly.

Next, the rear case 12C is arranged to face the opening end 114 of the front case 11C, as illustrated in FIG. 12B. Then, the rear case 12C is pressed against the front case 11C under a specified load to bring a plurality of terminals 32 of the external connector 30 into elastic contact with a plurality of electrodes 63 situated on the second board 22 of the board unit 20C. In this state, laser light L used for welding is irradiated onto the opening end 114 of the front case 11C from the side of a back surface of the rear case 12C. An irradiation direction is a direction of an arrow of the laser light L in FIG. 12B. Here, the laser light L is transmitted through a resin layer of the rear case 12C to be irradiated onto a portion, in the front case 11C, that corresponds to the opening end 114.

A region, in the opening end 114 of the front case 11C, that is irradiated with the laser light L generates heat due to absorption of the laser light L to be partially melted. On the other hand, the rear case 12C facing the opening end 114 is also partially melted due to heat transfer from a melted portion of the opening end 114. Thereafter, the melted portion of the opening end 114 and a melted portion of the rear case 12C are cooled to be solidified, and a welding portion welded to the rear case 12C is formed on the front case 11C. Accordingly, the front case 11C, the board unit 20C, and the rear case 12C are integrally joined to each other to produce the sensor module 300.

Effects similar to those described above can also be provided by the sensor module 300 having the configuration above according to the present embodiment. Note that an example of the configuration in which the barrel member 50 separate from the front case 11C is also included has been described in the present embodiment. However, the front case may also include a function as the barrel member, as in the second embodiment.

Fourth Embodiment

Figure 13:
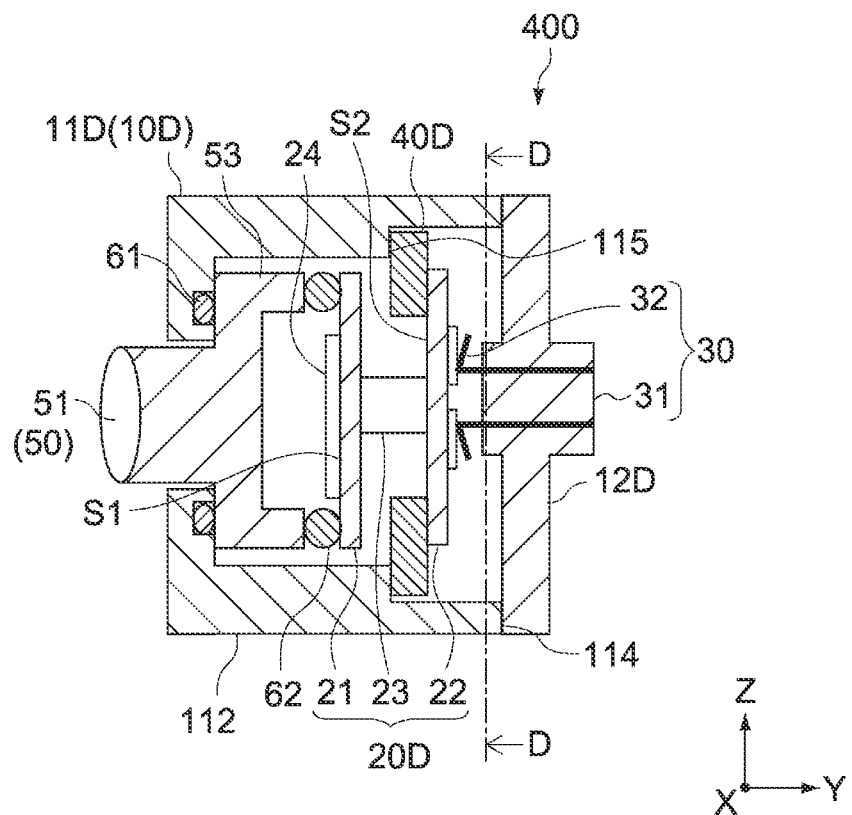
FIG. 13 is a schematic cross-sectional side view illustrating a configuration of a sensor module according to a fourth embodiment of the present technology.
Figure 14:
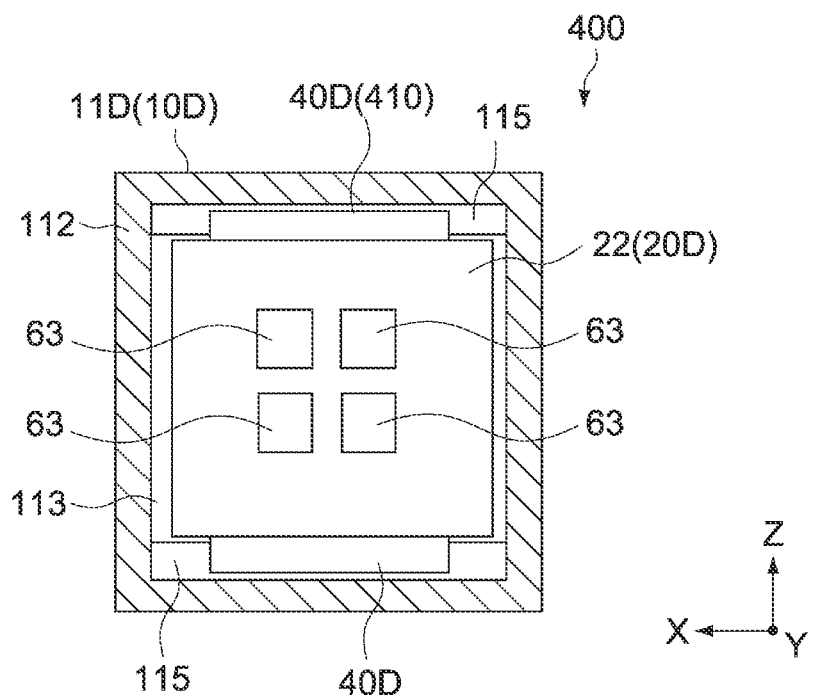
FIG. 14 is a cross-sectional view along the line D-D in FIG. 13.

FIG. 13 is a schematic cross-sectional side view illustrating a configuration of a sensor module 400 according to a fourth embodiment of the present technology, and FIG. 14 is a cross-sectional view along the line D-D in FIG. 13.

In the following description, a structural element that is different from the structural elements of the first embodiment is primarily described. A structural element similar to the structural element of the first embodiment is denoted by a reference numeral similar to the reference numeral used in the first embodiment, and a description thereof is omitted or simplified.

The sensor module 400 of the present embodiment includes a housing 10D, a board unit 20D, the external connector 30, and a joining member 40D.

The housing 10D includes a front case 11D that is a first case, a rear case 12D that is a second case, and the barrel member 50. The front case 11D and the rear case 12D respectively have configurations similar to the respective configurations of the front case 11A and the rear case 12A in the first embodiment. However, the present embodiment is different from the first embodiment in that the step portion 115 is provided to an inner surface of the opening end 114 of the front case 11D.

The board unit 20D includes the first board 21, the second board 22, and the board connector 23, and has a configuration similar to the configuration of the board unit 20A in the first embodiment. Since the same applies to the external connector 30, a description thereof is omitted.

The joining member 40D is mounted on the board unit 20D and welded to the housing 10D. The joining member 40D is mounted on a second surface S2 of the second board 22. In the present embodiment, the second surface S2 is the front surface being included in the second board 22 and facing the first board 21. As in the first embodiment, the joining member 40D includes the block and the base, and is mounted on a peripheral edge of the second surface S2. In the present embodiment, the block includes the protrusion 410 corresponding to a portion of the block that protrudes outward from the peripheral edge of the second board 22, and the protrusion 410 is welded to the step portion 115 of the front case 11D.

The step portion 115 of the front case 11D is provided to face the protrusion 410 of the joining member 40D, and, in the present embodiment, the step portion 115 is formed in a portion of the inner surface of the opening end 114 that is situated on the side of each of two sides of the shape of the opening end 114 that are parallel to the X-axis direction. The step portion 115 is formed at a depth that is greater than a height dimension of the joining member 40D in the Y-axis direction, and is formed to have a planar surface that can support the protrusion 410 of the joining member 40D. A width dimension of the step portion 115 in the Z-axis direction is not particularly limited, and it is sufficient if the step portion 115 has a width dimension that ensures a joining area with which a specified adhesion force is obtained between the step portion 115 and the protrusion 410 of the joining member 40D.

In the present embodiment, the rear case 12D and the joining member 40D are joined to the front case 11D using laser welding. In the present embodiment, the front case 11D is made of a resin material that has absorptive properties with respect to laser light of a specified wavelength. Further, the rear case 12D and the joining member 40D are made of a resin material that has transmissive properties with respect to the laser light of the specified wavelength. For example, red laser light of a wavelength of from 800 nm to 1100 nm is used as laser light used for welding. The various resin materials described in the first embodiment may be adopted as resin materials having absorptive properties or transmissive properties with respect to laser light.

Figure 15A:
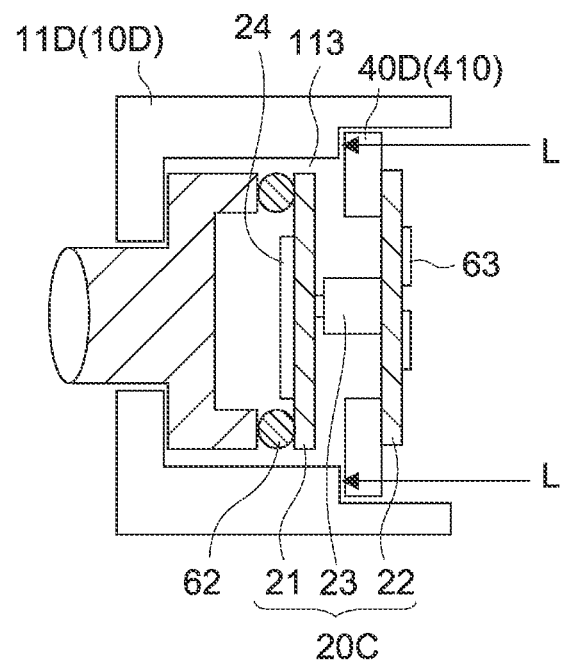
FIGS. 15A and 15B are sets of schematic cross-sectional side views used to describe a method for producing the sensor module.
Figure 15B:
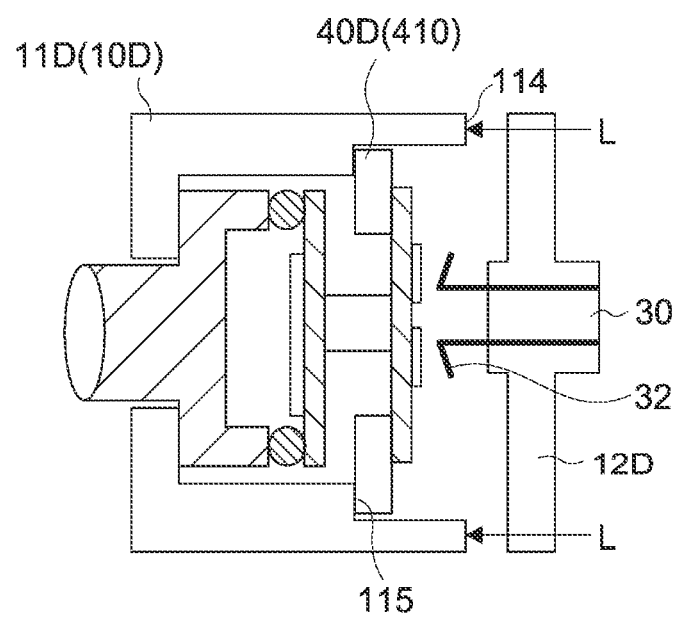

FIGS. 15A and 15B are schematic cross-sectional side views used to describe a method for producing the sensor module 400 having the configuration above according to the present embodiment.

First, the first board 21 on which the imaging device 24 is mounted and the second board 22 on which the joining member 40D is mounted are connected to each other through the board connector 23 to assemble the board unit 20D. Next, through the adhesive layer 62, the leg portion 53 of the barrel member 50 is joined to the front surface (the first surface S1) of the first board 21 on which the imaging device 24 is mounted to integrate the barrel member 50 and the board unit 20D. Then, the board unit 20D with the barrel member 50 is inserted into the space portion 113 of the front case 11D.

Next, in a state in which the second board 22 is pressed against the front case 11D under a specified load, laser light L used for welding is irradiated onto the protrusion 410 of the joining member 40D from the side of the back surface of the second board 22, as illustrated in FIG. 15A. An irradiation direction is a direction of an arrow of the laser light L in FIG. 15A. Here, the laser light L is transmitted through the protrusion 410 of the joining member 40D to be irradiated onto the step portion 115 of the front case 11D.

A region, in the step portion 115, that is irradiated with the laser light L generates heat due to absorption of the laser light L to be partially melted. On the other hand, the protrusion 410 being included in the joining member 40D and facing the step portion 115 is also partially melted due to heat transfer from a melted portion of the step portion 115. Thereafter, the melted portion of the step portion 115 and a melted portion of the protrusion 410 are cooled to be solidified, and a welding portion welded to the joining member 40D is formed on the front case 11D.

Here, when the board connector 23 is in a semi-insertion state, this enables the second board 22 to approach the first board 21. This makes it possible to join the front case 11D and the joining member 40D properly.

Next, the rear case 12D is arranged to face the opening end 114 of the front case 11D, as illustrated in FIG. 15B. Then, the rear case 12D is pressed against the front case 11D under a specified load to bring a plurality of terminals 32 of the external connector 30 into elastic contact with a plurality of electrodes 63 situated on the second board 22 of the board unit 20D. In this state, laser light L used for welding is irradiated onto the opening end 114 of the front case 11D from the side of a back surface of the rear case 12D. An irradiation direction is a direction of an arrow of the laser light L in (b) of FIG. 15B. Here, the laser light L is transmitted through a resin layer of the rear case 12D to be irradiated onto a portion, in the front case 11D, that corresponds to the opening end 114.

A region, in the opening end 114 of the front case 11D, that is irradiated with the laser light L generates heat due to absorption of the laser light L to be partially melted. On the other hand, the rear case 12D facing the opening end 114 is also partially melted due to heat transfer from a melted portion of the opening end 114. Thereafter, the melted portion of the opening end 114 and a melted portion of the rear case 12D are cooled to be solidified, and a welding portion welded to the rear case 12D is formed on the front case 11D. Accordingly, the front case 11D, the board unit 20D, and the rear case 12D are integrally joined to each other to produce the sensor module 400.

Effects similar to those described above can also be provided by the sensor module 400 having the configuration above according to the present embodiment. In the embodiment described above, the protrusion 410 protruding from the peripheral edge of the second board 22 is provided to the block of the joining member 40D. Without being limited thereto, the sensor module 400 may have a configuration illustrated in, for example, FIGS. 16 and 17.

Figure 16:
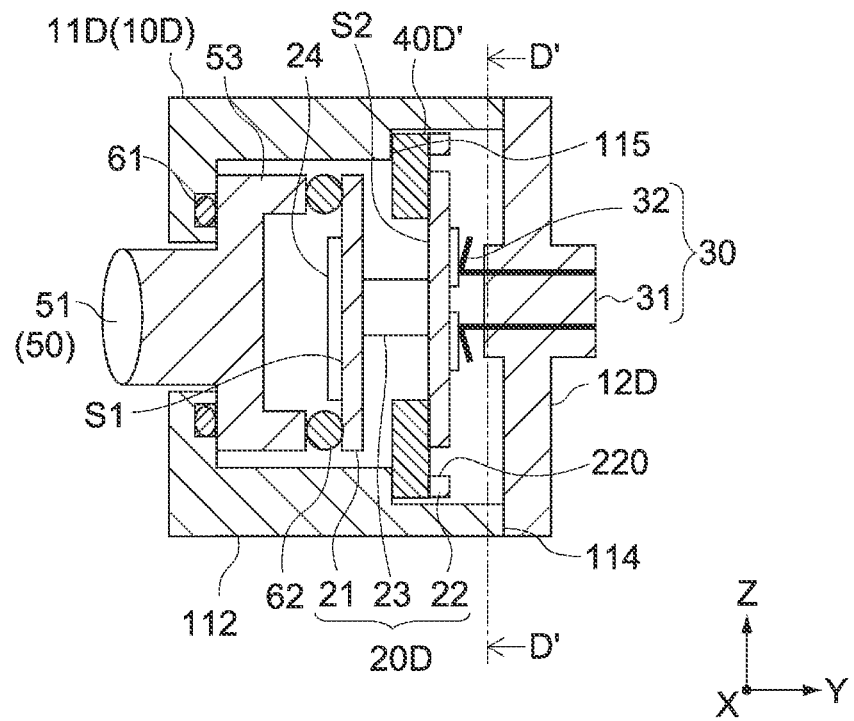
FIG. 16 is a schematic cross-sectional side view illustrating a modification of the configuration of the sensor module.
Figure 17:
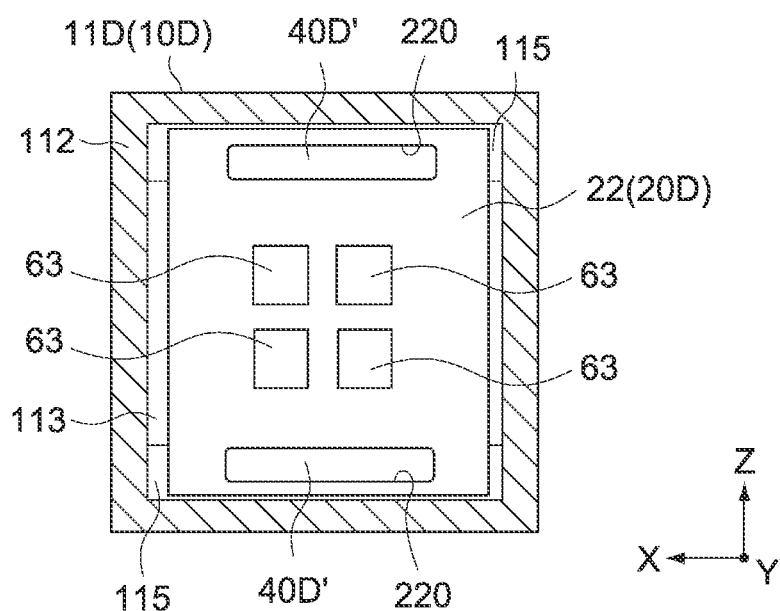
FIG. 17 is a cross-sectional view along the line D'-D' in FIG. 16.

FIG. 16 is a schematic cross-sectional side view illustrating a modification of the configuration of the sensor module 400, and FIG. 17 is a cross-sectional view along the line D'-D' in FIG. 16.

As illustrated in the figure, a joining member 40D' is mounted on a peripheral edge of the front surface (a second surface S2) of the second board 22 of the board unit 20D. In this example, the second board 22 is formed to have a larger area than the first board 21. The peripheral edge of the second board 22 protrudes further outward than the peripheral edge of the first board 21, and a window 220 through which a portion of the joining member 40D' is exposed on the side of the rear case 12D is provided to the peripheral edge of the second board 22. The window 220 is formed to be longitudinally rectangular in the X-axis direction, as illustrated in FIG. 17. Without being limited thereto, the window 220 may be a plurality of through-holes arranged in the X-axis direction.

This example makes it possible to perform stable pressing toward the step portion 115 of the front case 11D without the joining member 40D' having to be highly rigid, since the joining member 40D' is supported without protruding from the peripheral edge of the second board 22. Further, laser light L irradiated from the side of the back surface of the second board 22 can be irradiated onto the step portion 115 of the front case 11D through the window 220 and the joining member 40D', since the window 220 is provided to the peripheral edge of the second board 22.

Fifth Embodiment

Figure 18:
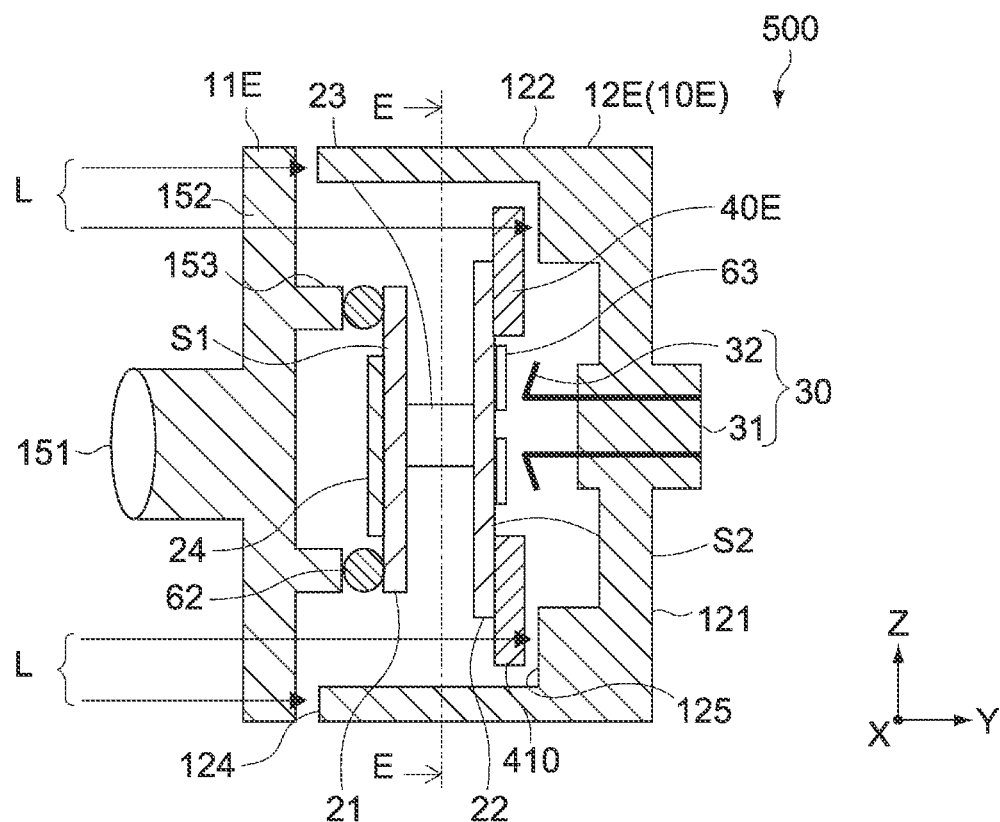
FIG. 18 is a schematic cross-sectional side view used to describe a configuration of a sensor module according to a fifth embodiment of the present technology and a method for producing the sensor module.
Figure 19:
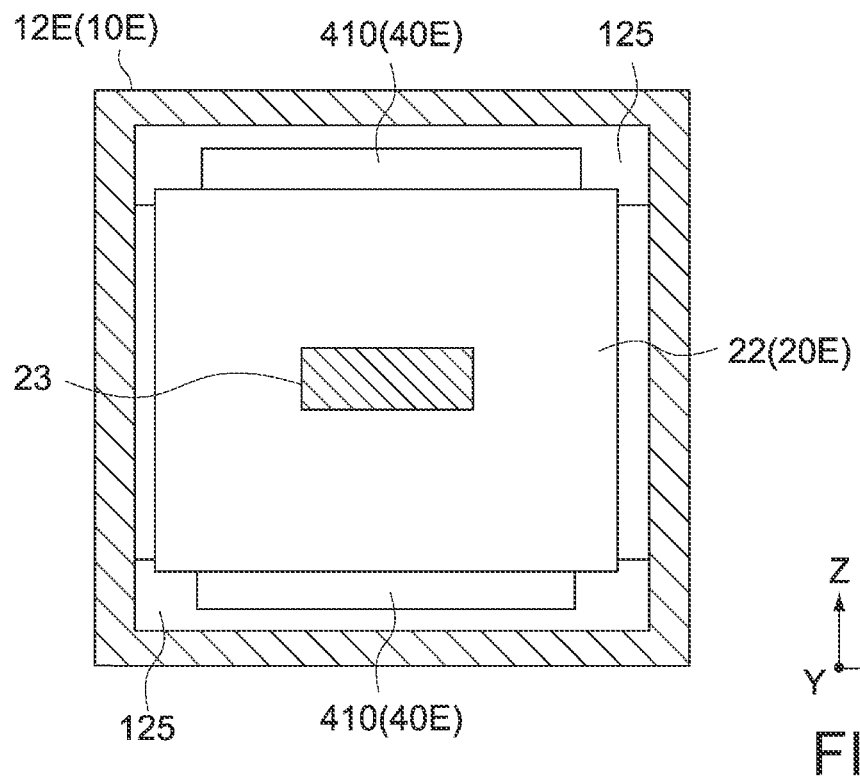
FIG. 19 is a cross-sectional view along the line E-E in FIG. 18.

FIG. 18 is a schematic cross-sectional side view used to describe a configuration of a sensor module 500 according to a fifth embodiment of the present technology and a method for producing the sensor module 500, and FIG. 19 is a cross-sectional view along the line E-E in FIG. 18.

In the following description, a structural element that is different from the structural elements of the second embodiment is primarily described. A structural element similar to the structural element of the second embodiment is denoted by a reference numeral similar to the reference numeral used in the second embodiment, and a description thereof is omitted or simplified.

The sensor module 500 of the present embodiment includes a housing 10E, a board unit 20E, the external connector 30, and a joining member 40E.

The housing 10E includes a front case 11E that is a first case, and a rear case 12E that is a second case. The front case 11E and the rear case 12E respectively have configurations similar to the respective configurations of the front case 11B and the rear case 12B in the second embodiment. However, the present embodiment is different from the second embodiment in that a step portion 125 is provided to an inner surface of the opening end 124 of the rear case 12E.

The board unit 20E includes the first board 21, the second board 22, and the board connector 23, and has a configuration similar to the configuration of the board unit 20B in the second embodiment. Since the same applies to the external connector 30, a description thereof is omitted.

The joining member 40E is mounted on the board unit 20E and welded to the housing 10E. The joining member 40E is mounted on a second surface S2 of the second board 22. In the present embodiment, the second surface S2 is the back surface being included in the second board 22 and facing the rear case 12E. As in the first embodiment, the joining member 40E includes the block and the base, and is mounted on a peripheral edge of the second surface S2. In the present embodiment, the block includes the protrusion 410 corresponding to a portion of the block that protrudes outward from the peripheral edge of the second board 22, and the protrusion 410 is welded to the step portion 125 of the rear case 12E.

The step portion 125 of the rear case 12E is provided to face the protrusion 410 of the joining member 40E, and, in the present embodiment, the step portion 125 is formed in a portion of the inner surface of the opening end 124 that is situated on the side of each of two sides of the shape of the opening end 124 that are parallel to the X-axis direction. The step portion 125 is formed at a depth that is greater than a height dimension of the joining member 40E in the Y-axis direction, and is formed to have a planar surface that can support the protrusion 410 of the joining member 40E. A width dimension of the step portion 125 in the Z-axis direction is not particularly limited, and it is sufficient if the step portion 125 has a width dimension that ensures a joining area with which a specified adhesion force is obtained between the step portion 125 and the protrusion 410 of the joining member 40E.

In the present embodiment, the front case 11E and the joining member 40E are joined to the rear case 12E using laser welding. In the present embodiment, the front case 11E and the joining member 40E are made of a resin material that has transmissive properties with respect to laser light of a specified wavelength. Further, the rear case 12E is made of a resin material that has absorptive properties with respect to the laser light of the specified wavelength. For example, red laser light of a wavelength of from 800 nm to 1100 nm is used as laser light used for welding. The various resin materials described in the first embodiment may be adopted as resin materials having absorptive properties or transmissive properties with respect to laser light.

With respect to the method for producing the sensor module 500, pieces of laser light L used for welding are respectively irradiated onto the opening end 124 and the step portion 125 of the rear case 12E from the side of the front surface of the front case 11E in a state in which the front case 11E and the protrusion 410 of the joining member 40E are respectively pressed against the opening end 124 and the step portion 125 under a specified load. Irradiation directions are directions of arrows of the pieces of laser light L in FIG. 19. Here, the pieces of laser light L are respectively transmitted through the front case 11E and the protrusion 410 of the joining member 40E, and the piece of laser light L transmitted through the front case 11E and the piece of laser light L transmitted through the protrusion 410 are respectively irradiated onto the opening end 124 and the step portion 125 of the rear case 12E. Accordingly, the front case 11E, the board unit 20E, and the rear case 12E are integrally joined to each other to produce the sensor module 500.

Figure 20:
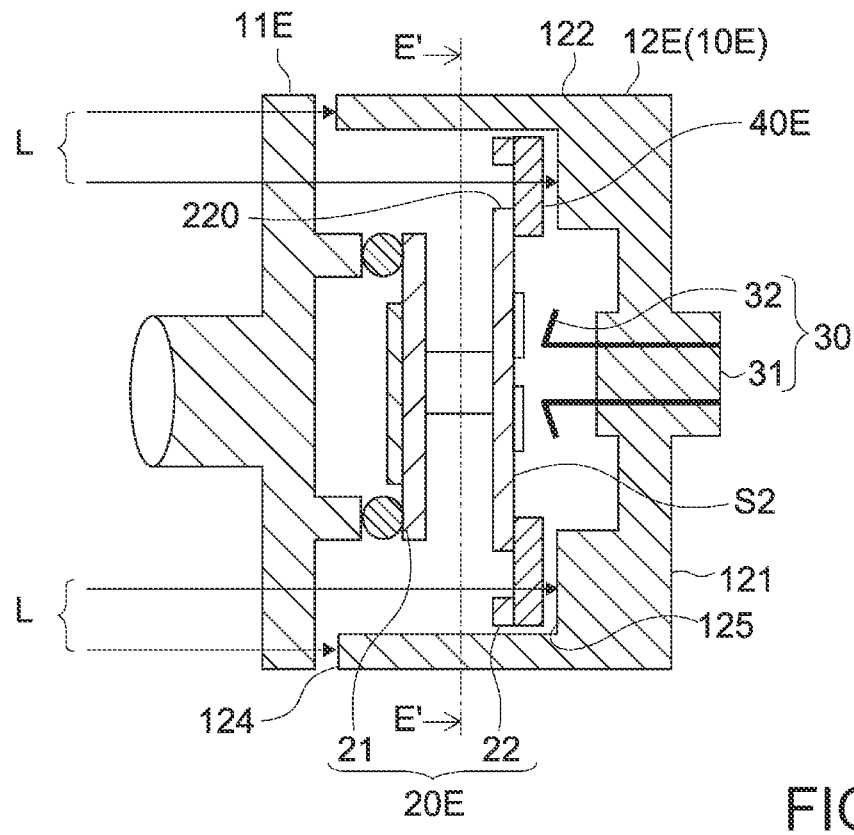
FIG. 20 is a schematic cross-sectional side view illustrating a modification of the configuration of the sensor module.
Figure 21:
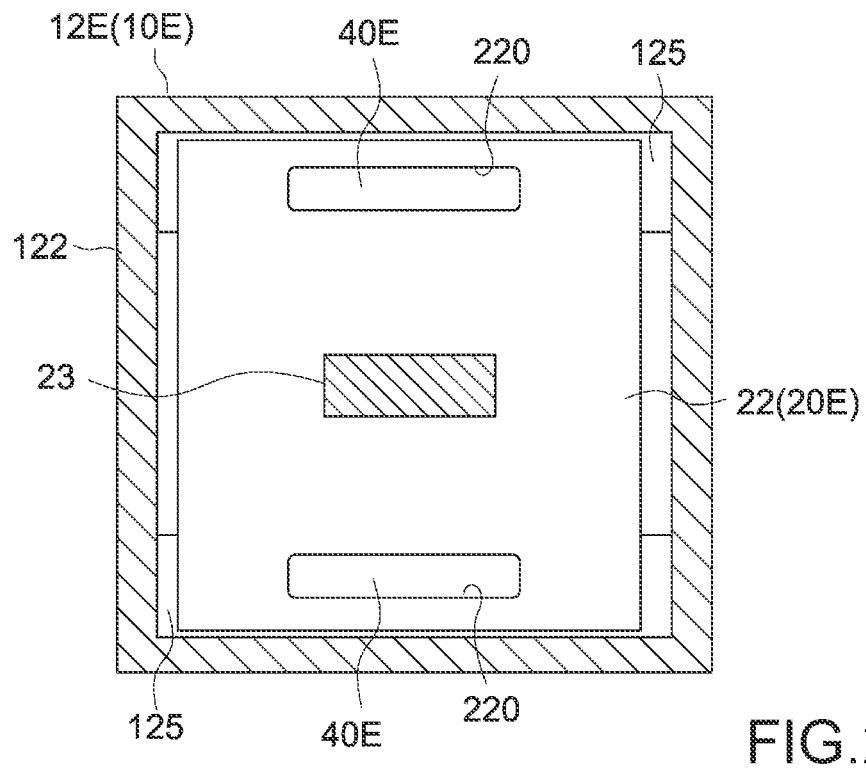
FIG. 21 is a cross-sectional view along the line E'-E' in FIG. 20.

FIG. 20 is a schematic cross-sectional side view illustrating a modification of the configuration of the sensor module 500, and FIG. 21 is a cross-sectional view along the line E'-E' in FIG. 20.

As illustrated in the figure, a joining member 40E' is mounted on a peripheral edge of the back surface (a second surface S2) of the second board 22 of the board unit 20E. In this example, the second board 22 is formed to have a larger area than the first board 21. The peripheral edge of the second board 22 protrudes further outward than the peripheral edge of the first board 21, and the window 220 through which a portion of the joining member 40E' is exposed on the side of the front case 11E is provided to the peripheral edge of the second board 22. The window 220 is formed to be longitudinally rectangular in the X-axis direction, as illustrated in FIG. 21. Without being limited thereto, the window 220 may be a plurality of through-holes arranged in the X-axis direction.

This example makes it possible to perform stable pressing toward the step portion 125 of the rear case 12E without the joining member 40E' having to be highly rigid, since the joining member 40E' is supported without protruding from the peripheral edge of the second board 22. Further, laser light L irradiated from the side of the front surface of the front case 11E can be irradiated onto the step portion 125 of the rear case 12E through the window 220 and the joining member 40E', since the window 220 is provided to the peripheral edge of the second board 22.

Sixth Embodiment

Figure 22:
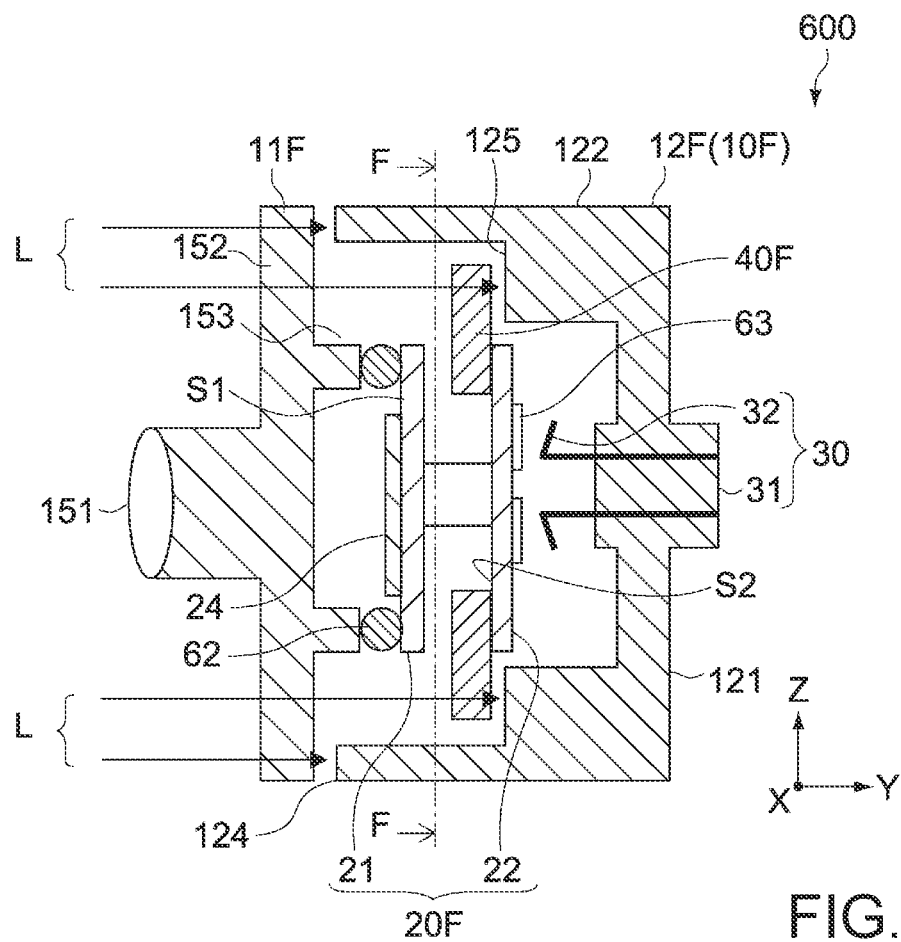
FIG. 22 is a schematic cross-sectional side view used to describe a configuration of a sensor module according to a sixth embodiment of the present technology and a method for producing the sensor module.
Figure 23:
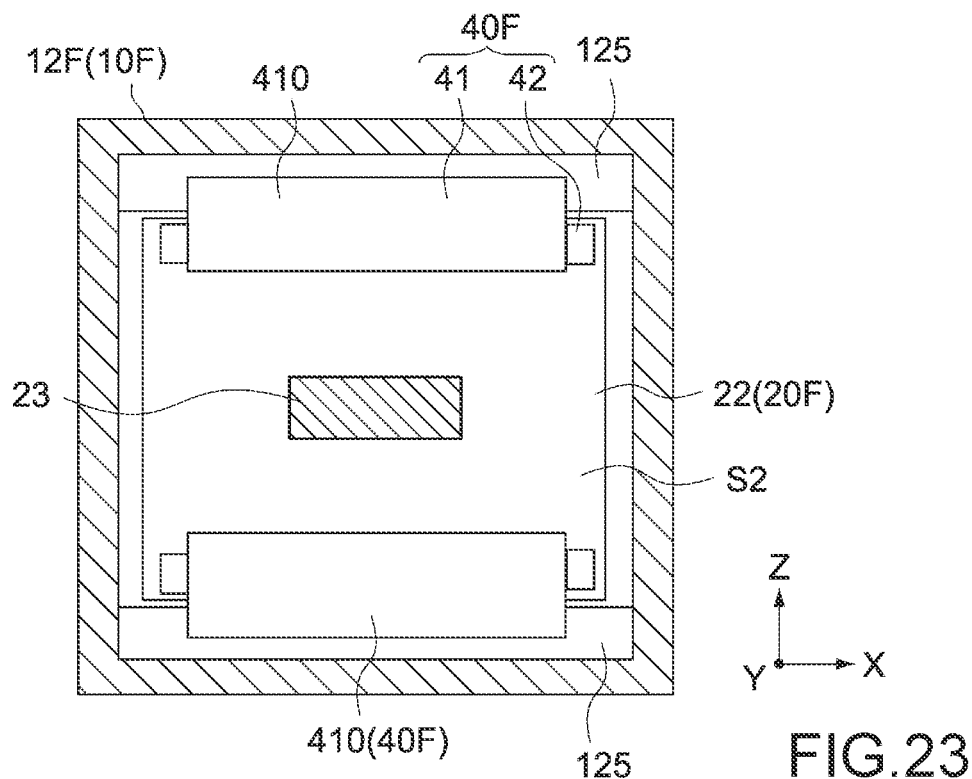
FIG. 23 is a cross-sectional view along the line F-F in FIG. 22.

FIG. 22 is a schematic cross-sectional side view used to describe a configuration of a sensor module 600 according to a sixth embodiment of the present technology and a method for producing the sensor module 600, and FIG. 23 is a cross-sectional view along the line F-F in FIG. 22.

In the following description, a structural element that is different from the structural elements of the second embodiment is primarily described. A structural element similar to the structural element of the second embodiment is denoted by a reference numeral similar to the reference numeral used in the second embodiment, and a description thereof is omitted or simplified.

The sensor module 600 of the present embodiment includes a housing 10F, a board unit 20F, the external connector 30, and a joining member 40F.

The housing 10F includes a front case 11F that is a first case, and a rear case 12F that is a second case. The front case 11F and the rear case 12F respectively have configurations similar to the respective configurations of the front case 11B and the rear case 12B in the second embodiment. However, the present embodiment is different from the second embodiment in that the step portion 125 is provided to an inner surface of the opening end 124 of the rear case 12F.

The board unit 20F includes the first board 21, the second board 22, and the board connector 23, and has a configuration similar to the configuration of the board unit 20B in the second embodiment. Since the same applies to the external connector 30, a description thereof is omitted.

The joining member 40F is mounted on the board unit 20F and welded to the housing 10F. The joining member 40F is mounted on a second surface S2 of the second board 22. In the present embodiment, the second surface S2 is the front surface being included in the second board 22 and facing the first board 21. As in the first embodiment, the joining member 40F includes the block 41 and the base 42, and is mounted on a peripheral edge of the second surface S2. In the present embodiment, the block 41 includes the protrusion 410 corresponding to a portion of the block 41 that protrudes outward from the peripheral edge of the second board 22, and the protrusion 410 is welded to the step portion 125 of the rear case 12E.

The step portion 125 of the rear case 12E is provided to face the protrusion 410 of the joining member 40F, and, in the present embodiment, the step portion 125 is formed in a portion of the inner surface of the opening end 124 that is situated on the side of each of two sides of the shape of the opening end 124 that are parallel to the X-axis direction. The step portion 125 is formed at a depth that is greater than a height dimension of the joining member 40F in the Y-axis direction, and is formed to have a planar surface that can support the protrusion 410 of the joining member 40F. A width dimension of the step portion 125 in the Z-axis direction is not particularly limited, and it is sufficient if the step portion 125 has a width dimension that ensures a joining area with which a specified adhesion force is obtained between the step portion 125 and the protrusion 410 of the joining member 40F.

In the present embodiment, the front case 11F and the joining member 40F are joined to the rear case 12F using laser welding. In the present embodiment, the front case 11F and the joining member 40F are made of a resin material that has transmissive properties with respect to laser light of a specified wavelength. Further, the rear case 12F is made of a resin material that has absorptive properties with respect to the laser light of the specified wavelength. For example, red laser light of a wavelength of from 800 nm to 1100 nm is used as laser light used for welding. The various resin materials described in the first embodiment may be adopted as resin materials having absorptive properties or transmissive properties with respect to laser light.

With respect to the method for producing the sensor module 600, pieces of laser light L used for welding are respectively irradiated onto the opening end 124 and the step portion 125 of the rear case 12F from the side of the front surface of the front case 11F in a state in which the front case 11F and the protrusion 410 of the joining member 40F are respectively pressed against the opening end 124 and the step portion 125 under a specified load. Irradiation directions are directions of arrows of the pieces of laser light L in FIG. 22. Here, the pieces of laser light L are respectively transmitted through the front case 11F and the protrusion 410 of the joining member 40F, and the piece of laser light L transmitted through the front case 11F and the piece of laser light L transmitted through the protrusion 410 are respectively irradiated onto the opening end 124 and the step portion 125 of the rear case 12F. Accordingly, the front case 11F, the board unit 20F, and the rear case 12F are integrally joined to each other to produce the sensor module 500.

<Modifications>

The technology according to the present disclosure can be applied to various products. For example, the technology according to the present disclosure may be provided as a sensor module that is mounted on one of the types of mobile bodies such as vehicle, electric vehicle, hybrid electric vehicle, motorcycle, bicycle, personal mobility, airplane, drone, ship, robot, construction machinery, and agricultural machinery (tractor).

Further, a camera module has been described as an example of the sensor modules 100 to 600 in the embodiments described above. However, the present technology is not limited thereto. For example, the present technology can also be adopted for a sensor module that includes, as a sensor element, a ranging sensor such as light detection and ranging (LiDAR) or a time-of-flight (ToF) sensor.

Note that the present technology may also take the following configurations.

(1) A sensor module, including:
   a housing that includes a first case, and a second case that is welded to the first case;
   a board unit that includes a sensor element, and is arranged in the housing;
   an external connector that is provided to the second case, and includes an elastically deformable terminal that is electrically connected to the board unit; and
   a joining member that is mounted on the board unit and welded to the housing.

(2) The sensor module according to (1), in which
   the board unit includes
   a first board that includes a first surface that supports the sensor element,
   a second board that includes a second surface that supports the joining member, and
   a board connector that connects the first board and the second board.

(3) The sensor module according to (2), in which
   the second surface is a surface that faces the second case, and the joining member is welded to the second case.

(4) The sensor module according to (3), in which
   the first case and the joining member are made of a synthetic-resin material that has absorptive properties with respect to laser light of a specified wavelength, and
   the second case is made of a synthetic-resin material that has transmissive properties with respect to the laser light.

(5) The sensor module according to (3), in which
the first case and the joining member are made of a synthetic-resin material that has transmissive properties with respect to laser light of a specified wavelength, and
the second case is made of a synthetic-resin material that has absorptive properties with respect to the laser light.
(6) The sensor module according to (2), in which
the second surface is a surface that faces the first board, and
the joining member is welded to the first case.
(7) The sensor module according to (6), in which
the first case is made of a synthetic-resin material that has transmissive properties with respect to laser light of a specified wavelength, and
the second case and the joining member are made of a synthetic-resin material that has absorptive properties with respect to the laser light.
(8) The sensor module according to (6), in which
the first case is made of a synthetic-resin material that has absorptive properties with respect to laser light of a specified wavelength, and
the second case and the joining member are made of a synthetic-resin material that has transmissive properties with respect to the laser light.
(9) The sensor module according to (2), in which
the second surface is a surface that faces the second case, and
the joining member is welded to the first case.
(10) The sensor module according to (9), in which
the first case is made of a synthetic-resin material that has absorptive properties with respect to laser light of a specified wavelength, and
the second case and the joining member are made of a synthetic-resin material that has transmissive properties with respect to the laser light.
(11) The sensor module according to (2), in which
the second surface is a surface that faces the first board, and
the joining member is welded to the second case.
(12) The sensor module according to (11), in which
the first case and the joining member are made of a synthetic-resin material that has transmissive properties with respect to laser light of a specified wavelength, and
the second case is made of a synthetic-resin material that has absorptive properties with respect to the laser light.
(13) The sensor module according to any one of (2) to (12), in which
the sensor element is a solid-state imaging device, and
the housing further includes a barrel member that includes a barrel and a joining portion, the barrel being fitted into the first case, the joining portion being joined to the first surface.
(14) The sensor module according to any one of (2) to (12), in which
the sensor element is a solid-state imaging device, and
the first case includes a barrel, and a joining portion that is joined to the first surface.
(15) The sensor module according to any one of (2) to (14), in which
the joining member includes a plurality of block materials arranged in a peripheral region of the second surface.
(16) The sensor module according to any one of (2) to (14), in which
the joining member is an annular member that is arranged in a peripheral region of the second surface.

REFERENCE SIGNS LIST 10A, 10B, 10C, 10D, 10E, 10F housing
11A, 11B, 11C, 11D, 11E, 11F front case (first case)
12A, 12B, 12C, 12D, 12E, 12F rear case (second case)
20A, 20B, 20C, 20D, 20E, 20F board unit
21 first board
22 second board
23 board connector
24 imaging device (sensor element)
30 external connector
32 terminal
40A, 40A', 40B, 40C, 40D, 40D', 40E, 40F joining member
50 barrel member
51, 151 barrel
53, 153 leg portion (joining portion)
100, 200, 300, 400, 500, 600 sensor module
114, 124 opening end
115, 125 step portion
L laser light
S1 first surface
S2 second surface

The invention claimed is:
1. A sensor module, comprising:
a housing that includes:
a first case, and
a second case, wherein the second case is welded to the first case;
a board unit that includes:
a sensor element,
a first board including a first surface that supports the sensor element,
a second board including a second surface that supports a joining member, and
a board connector configured to connect the first board and the second board, wherein the board unit is in the housing;
an external connector on the second case, wherein
the external connector includes an elastically deformable terminal that is electrically connected to the board unit; and
the joining member that is on the board unit and is welded to the housing.
2. The sensor module according to claim 1, wherein
the second surface is a surface that faces the second case, and
the joining member is welded to the second case.
3. The sensor module according to claim 2, wherein
the first case and the joining member are made of a synthetic-resin material that has absorptive properties with respect to laser light of a specific wavelength, and
the second case is made of a synthetic-resin material that has transmissive properties with respect to the laser light.
4. The sensor module according to claim 2, wherein
the first case and the joining member are made of a synthetic-resin material that has transmissive properties with respect to laser light of a specified wavelength, and
the second case is made of a synthetic-resin material that has absorptive properties with respect to the laser light.
5. The sensor module according to claim 1, wherein
the second surface is a surface that faces the first board, and
the joining member is welded to the first case.
6. The sensor module according to claim 5, wherein
the first case is made of a synthetic-resin material that has transmissive properties with respect to laser light of a specified wavelength, and the second case and the joining member are made of a synthetic-resin material that has absorptive properties with respect to the laser light.

7. The sensor module according to claim 5, wherein
the first case is made of a synthetic-resin material that has absorptive properties with respect to laser light of a specified wavelength, and
the second case and the joining member are made of a synthetic-resin material that has transmissive properties with respect to the laser light.

8. The sensor module according to claim 1, wherein
the second surface is a surface that faces the second case, and
the joining member is welded to the first case.

9. The sensor module according to claim 8, wherein
the first case is made of a synthetic-resin material that has absorptive properties with respect to laser light of a specified wavelength, and
the second case and the joining member are made of a synthetic-resin material that has transmissive properties with respect to the laser light.

10. The sensor module according to claim 1, wherein
the second surface is a surface that faces the first board, and
the joining member is welded to the second case.

11. The sensor module according to claim 10, wherein
the first case and the joining member are made of a synthetic-resin material that has transmissive properties with respect to laser light of a specified wavelength, and
the second case is made of a synthetic-resin material that has absorptive properties with respect to the laser light.

12. The sensor module according to claim 1, wherein
the sensor element is a solid-state imaging device, and
the housing further includes a barrel member that includes:
 a barrel that is fitted into the first case, and
 a joining portion that is joined to the first surface.

13. The sensor module according to claim 1, wherein
the sensor element is a solid-state imaging device, and
the first case includes:
 a barrel, and
 a joining portion that is joined to the first surface.

14. The sensor module according to claim 1, wherein the joining member includes a plurality of block materials in a peripheral region of the second surface.

15. The sensor module according to claim 1, wherein the joining member is an annular member that is in a peripheral region of the second surface.

* * * * *